(12) United States Patent
Yamazaki et al.

(10) Patent No.: US 7,709,843 B2
(45) Date of Patent: May 4, 2010

(54) DISPLAY DEVICE AND METHOD FOR MANUFACTURING THE SAME, AND TELEVISION RECEIVER

(75) Inventors: Shunpei Yamazaki, Tokyo (JP); Shinji Maekawa, Shizuoka (JP); Makoto Furuno, Kanagawa (JP); Osamu Nakamura, Kanagawa (JP); Keitaro Imai, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 676 days.

(21) Appl. No.: 10/574,880

(22) PCT Filed: Oct. 25, 2004

(86) PCT No.: PCT/JP2004/016169

§ 371 (c)(1),
(2), (4) Date: Apr. 6, 2006

(87) PCT Pub. No.: WO2005/041310

PCT Pub. Date: May 6, 2005

(65) Prior Publication Data

US 2007/0051958 A1 Mar. 8, 2007

(30) Foreign Application Priority Data

Oct. 28, 2003 (JP) .............................. 2003-368160

(51) Int. Cl.
*H01L 29/786* (2006.01)
(52) U.S. Cl. .................... 257/72; 257/59; 257/E27.131; 257/E29.151
(58) Field of Classification Search .................... 257/59, 257/72, E27.131, E27.132, E27.152, E29.151
See application file for complete search history.

(56) References Cited

U.S. PATENT DOCUMENTS 5,989,945 A 11/1999 Yudasaka et al.

(Continued)

FOREIGN PATENT DOCUMENTS

EP 0 855 614 A1 7/1998

(Continued)

OTHER PUBLICATIONS

International Search Report of Application No. PCT/JP2004/016169; PCT7464) Dated Dec. 7, 2004.

(Continued)

*Primary Examiner*—David Vu
*Assistant Examiner*—Earl N Taylor
(74) *Attorney, Agent, or Firm*—Nixon Peabody LLP; Jeffrey L. Costellia

(57) ABSTRACT

According to the present invention, which is a display device in which a light-emitting element where an organic substance generating luminescence referred to as electroluminescence or a medium including a mixture of an organic substance and an inorganic substance is sandwiched between electrodes is connected to a TFT, the invention is to manufacture a display panel by forming at least one or more of a conductive layer which forms a wiring or an electrode and a pattern necessary for manufacturing a display panel such as a mask layer for forming a predetermined pattern is formed by a method capable of selectively forming a pattern. A droplet discharge method capable of forming a predetermined pattern by selectively discharging a droplet of a composition in accordance with a particular object and by forming a conductive layer or an insulating layer is used as a method capable of selectively forming a pattern.

9 Claims, 31 Drawing Sheets

U.S. PATENT DOCUMENTS

| | | | |
|---|---|---|---|
| 6,291,136 | B1 | 9/2001 | Masutani et al. |
| 6,294,401 | B1 * | 9/2001 | Jacobson et al. ............... 438/99 |
| 6,323,143 | B1 * | 11/2001 | Yu ............................. 438/791 |
| 6,593,591 | B2 | 7/2003 | Yudasaka et al. |
| 6,849,308 | B1 | 2/2005 | Speakman et al. |
| 6,891,236 | B1 * | 5/2005 | Yamazaki ................... 257/410 |
| 2002/0044111 | A1 | 4/2002 | Yamazaki et al. |
| 2002/0074547 | A1 | 6/2002 | Yudasaka et al. |
| 2002/0100908 | A1 | 8/2002 | Yudasaka et al. |
| 2002/0179906 | A1 | 12/2002 | Yudasaka et al. |
| 2003/0054653 | A1 | 3/2003 | Yamazaki et al. |
| 2003/0134519 | A1 | 7/2003 | Yudasaka et al. |
| 2004/0147113 | A1 | 7/2004 | Yamazaki et al. |
| 2005/0074963 | A1 * | 4/2005 | Fujii et al. ................... 438/623 |
| 2006/0073667 | A1 * | 4/2006 | Li et al. ...................... 438/311 |

FOREIGN PATENT DOCUMENTS

| | | |
|---|---|---|
| EP | 1 163 552 B1 | 8/2003 |
| EP | 1 445 793 A2 | 8/2004 |
| EP | 1 450 412 A2 | 8/2004 |
| JP | 04-056168 | 2/1992 |
| JP | 07-297404 | 11/1995 |
| JP | 10-270843 | 10/1998 |
| JP | 11-326951 | 11/1999 |
| JP | 2000-029053 | 1/2000 |
| JP | 2002-049333 | 2/2002 |
| JP | 2002-359246 | 12/2002 |
| JP | 2003-506886 | 2/2003 |
| JP | 2003-098548 | 4/2003 |
| JP | 2003-258226 | 9/2003 |
| WO | WO 97/43689 | 11/1997 |
| WO | WO 01/11426 A1 | 2/2001 |

OTHER PUBLICATIONS

Written Opinion (Application No. PCT/JP2004/016169; PCT7464) Dated Dec. 7, 2004.

* cited by examiner

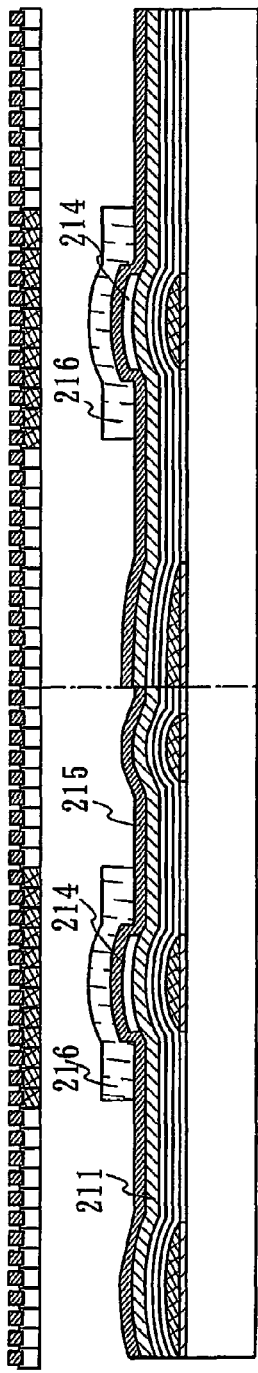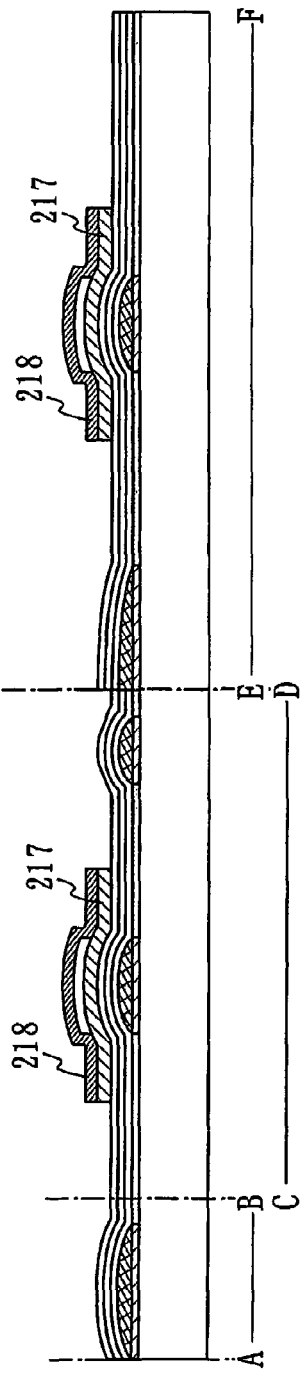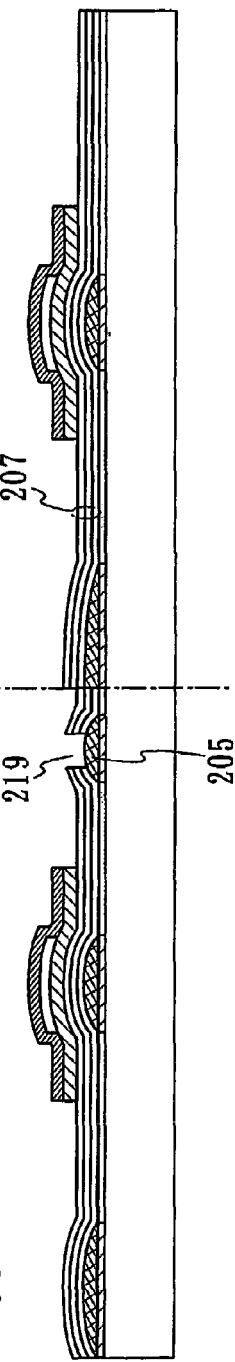

500
501
502

DISPLAY DEVICE AND METHOD FOR MANUFACTURING THE SAME, AND TELEVISION RECEIVER

TECHNICAL FIELD

The present invention relates to a display device to which an active element such as a transistor formed over a glass substrate is applied and to a method for manufacturing the same.

BACKGROUND ART

Conventionally, a display panel of a so-called active matrix driving method constituted by a thin film transistor (hereinafter also referred to as a "TFT") over a glass substrate is known. As well as a manufacturing technique of a semiconductor integrated circuit, this display panel needs a step of patterning a thin film such as a conductor, a semiconductor, or an insulator due to a light-exposure step using a photomask.

A size of a mother glass substrate used for manufacturing a display panel is enlarged from 300 mm×400 mm of the first generation in the early 1990s to 680 mm×880 mm or 730 mm×920 mm of the fourth generation in 2000. Furthermore, the manufacturing technique made such a development that a number of display panels can be obtained from one substrate.

When a size of a glass substrate or a display panel is small, patterning treatment can be carried out comparatively easily by using a photolithography machine. However, as a substrate size is enlarged, an entire surface of a display panel cannot be simultaneously treated by carrying out light-exposure treatment once. Consequently, it is necessary to divide a region where a photoresist is applied into a plurality of block regions and to carry out light-exposure treatment on every predetermined block regions. As for light-exposure treatment, a method for exposing an entire surface of a substrate to light by sequentially repeating the treatment has been developed (for example, see Reference 1: Japanese Patent Application Laid-Open No. Hei 11-326951 and Reference 2: U.S. Pat. No. 6,291,136).

DISCLOSURE OF INVENTION

However, a glass substrate is further enlarged to a size of 1000 mm×1200 mm or 1100 mm×1300 mm in the fifth generation, and a size of 1500 mm×1800 mm or more is assumed in the next generation. A large sized glass substrate is effective in enlarging an area and increasing the number of a display panel to be obtained; however, it is difficult to manufacture a display panel at good productivity by low cost in a conventional patterning method. In other words, when a plurality of times of light-exposure is carried out by consecutive light exposure, a processing time is increased and tremendous investment is required for developing a photolithography machine that can treat a large-sized glass substrate.

Moreover, in a method for forming various types of thin films over an entire surface of a substrate and for removing the thin films to leave a slight region by etching, there is a problem that a material cost is wasted and disposal of a large quantity of effluent is forced.

In view of the above situation, the object of the present invention is to provide a display device capable of improving utilizing efficiency of a material and of simplifying a manufacturing step and a manufacturing technique thereof.

Means to Solve the Problem

According to one aspect of the present invention, at least one or more of a conductive layer which forms a wiring or an electrode and a pattern necessary for manufacturing a display panel such as a mask for forming a predetermined pattern is formed by a method capable of selectively forming a pattern to manufacture a display panel. A droplet discharge method (also referred to as a ink-jet method by the system to be applied) capable of forming a predetermined pattern by selectively discharging a droplet of a composition in accordance with a particular object is used as a method capable of selectively forming a pattern.

In the invention, the above-mentioned object is achieved by completing a display device, by using a droplet discharge method, in which a TFT is connected to a light-emitting element where an organic material generating luminescence referred to as electroluminescence (hereinafter also referred to as "EL") or a medium including a mixture of an organic material and an inorganic material is sandwiched between electrodes.

According to another aspect of the invention, a method for manufacturing a light-emitting device comprises the steps of: forming a gate electrode over a substrate having an insulating surface with a droplet discharge method; laminating a gate insulating layer, a semiconductor layer, and an insulating layer over the gate electrode; forming a first mask in a position overlapping with the gate electrode with a droplet discharge method; forming a channel protective layer by etching the insulating layer by the first mask; forming a semiconductor layer containing one conductivity type impurity; forming a second mask in a region including the gate electrode with a droplet discharge method; etching the semiconductor layer containing one conductivity type impurity and the semiconductor layer under the semiconductor layer containing one conductivity type impurity; forming wirings to be connected to a source and a drain with a droplet discharge method; and, etching the semiconductor layer containing one conductivity type impurity on the channel protective layer by using the wirings to be connected to the source and the drain as masks.

According to another aspect of the invention, a method for manufacturing a light-emitting device comprises the steps of: forming a gate electrode and a connection wiring over a substrate having an insulating surface with a droplet discharge method; laminating a gate insulating layer, a semiconductor layer, and an insulating layer over the gate electrode; forming a first mask in a position overlapping with the gate electrode with a droplet discharge method; forming a channel protective layer by etching the insulating layer by the first mask; forming a semiconductor layer containing one conductivity type impurity; forming a second mask in a region including the gate electrode with a droplet discharge method; etching the semiconductor layer containing one conductivity type impurity and the semiconductor layer under the semiconductor layer containing one conductivity type impurity; partially exposing the connection wiring by selectively etching the gate insulating layer; forming wirings to be connected to a source and a drain with a droplet discharge method and connecting at least one of the wirings to the connection wiring, and etching the semiconductor layer containing one conductivity type impurity on the channel protective layer by using the wirings to be connected to the source and the drain as masks.

In the above-mentioned step of laminating a gate insulating layer, a semiconductor layer, and an insulating layer over the gate electrode, it is preferable to successively form each layer of the gate insulating layer, the semiconductor layer, and the insulating layer without exposing to the atmosphere by a vapor phase growth method using plasma (plasma CVD) or a sputtering method.

By sequentially laminating a first silicon nitride film, a silicon oxide film, and a second silicon nitride film to form a gate insulating film, the gate electrode can be prevented from being oxidized and a satisfactory interface between the gate insulating film and the semiconductor layer formed over the upper layer side of the gate insulating film can be formed.

As mentioned above, according to the other aspect of the invention, the gate electrode, the wiring, and the mask used during patterning are formed by a droplet discharge method. However, at least one or more of patterns necessary for manufacturing an EL display device is formed by a method capable of selectively forming a pattern to manufacture a display device, thereby achieving the object.

According to the following aspect of the invention, a display device has a pixel portion arranging in a matrix a light-emitting element where an organic material including a light-emitting material generating EL or a medium including a mixture of an organic material and an inorganic material is sandwiched between a pair of electrodes, and capable of controlling a luminescent state and non-luminescent state by connecting each light-emitting element to a TFT.

According to the other aspect of the invention, a light-emitting device comprises: a light-emitting element in which a light-emitting material is sandwiched between a pair of electrodes; and a thin film transistor including from a substrate side a lamination of: a gate electrode formed by making fusion and/or welding (by fusing) of conductive nanoparticles; a gate insulating layer at least containing a silicon nitride layer or a silicon nitride oxide layer formed to be in contact with the gate electrode, and a silicon oxide layer; and a semiconductor layer, wherein a pixel in which the light-emitting element and the thin film transistor are connected is provided.

According to the other aspect of the invention, a light-emitting device comprises: a light-emitting element in which a light-emitting material is sandwiched between a pair of electrodes; and a thin film transistor including from a substrate side a lamination of: a gate electrode formed by making fusion and/or welding (by fusing) of conductive nanoparticles; a gate insulating layer at least containing a silicon nitride layer or a silicon nitride oxide layer formed to be in contact with the gate electrode, and a silicon oxide layer, a semiconductor layer, wirings connected to a source and a drain and formed by making fusion and/or welding (by fusing) of conductive nanoparticles; and a silicon nitride layer or silicon nitride oxide layer formed to be in contact with the wirings, wherein a pixel in which the light-emitting element and the thin film transistor are connected is provided.

According to the other aspect of the invention, a light-emitting device comprises: a light-emitting element in which a light-emitting material is sandwiched between a pair of electrodes; and a first thin film transistor including from a substrate side a lamination of: a gate electrode formed by making fusion and/or welding (by fusing) of conductive nanoparticles; a gate insulating layer at least containing a silicon nitride layer or a silicon nitride oxide layer formed to be in contact with the gate electrode, and a silicon oxide layer; and a semiconductor layer; a driver circuit including a second thin film transistor formed by having the same layer structure as that of the first thin film transistor; and a wiring extended from the driver circuit and connecting to the gate electrode of the first thin film transistor, wherein the light-emitting element and a pixel connected to the first thin film transistor are provided.

According to other aspect of the invention, a light-emitting device comprises: a light-emitting element in which a light-emitting material is sandwiched between a pair of electrodes; and a first thin film transistor including, from a substrate side, a lamination of: a gate electrode formed by making fusion and/or welding (by fusing) of conductive nanoparticles; a gate insulating layer at least containing a silicon nitride layer or a silicon nitride oxide layer formed to be in contact with the gate electrode, and a silicon oxide layer; a semiconductor layer; wirings connected to a source and a drain and formed by making fusion and/or welding (by fusing) of conductive nanoparticles; and a silicon nitride layer or silicon nitride oxide layer formed to be in contact with the wirings; a driver circuit including a second thin film transistor formed by having the same layer structure as that of the first thin film transistor; and a wiring extended from the driver circuit and connecting to the gate electrode of the first thin film transistor, wherein the light-emitting element and a pixel connected to the first thin film transistor are provided.

According to the invention, the gate electrode or the wiring is formed with a droplet discharge method, and a conductive material can be formed of Ag or an alloy containing Ag. In addition, a silicon nitride film or a silicon nitride oxide film is provided over the gate electrode or an upper layer of the wiring by being in contact; therefore, the gate electrode can be prevented from being deteriorated due to oxidization.

In the invention, it is also possible that the semiconductor layer, which is a main portion of a TFT, contains hydrogen and halogen, and is formed from a semi-amorphous semiconductor containing a crystal structure. Accordingly, a driver circuit only including an n-channel type TFT can be provided. In other words, the semiconductor layer contains hydrogen and halogen and is a semiconductor having a crystal structure, thereby realizing the driver circuit over one substrate by the TFT which is capable of being operated with electric field effect mobility of from 1 $cm^2/V \cdot sec$ to 15 $cm^2/V \cdot sec$ $cm^2$.

According to the present invention, patterning of a wiring or a mask can be carried out directly by a droplet discharge method; therefore, a TFT in which utilization efficiency of a material is improved and a manufacturing step is simplified, and a display device using the TFT can be obtained.

BRIEF DESCRIPTION OF THE DRAWINGS

FIGS. 5A to 5C each show cross-sectional views illustrating a step of manufacturing an EL display panel according to certain aspects of the invention;

BEST MODE FOR CARRYING OUT THE INVENTION

Figure 1:
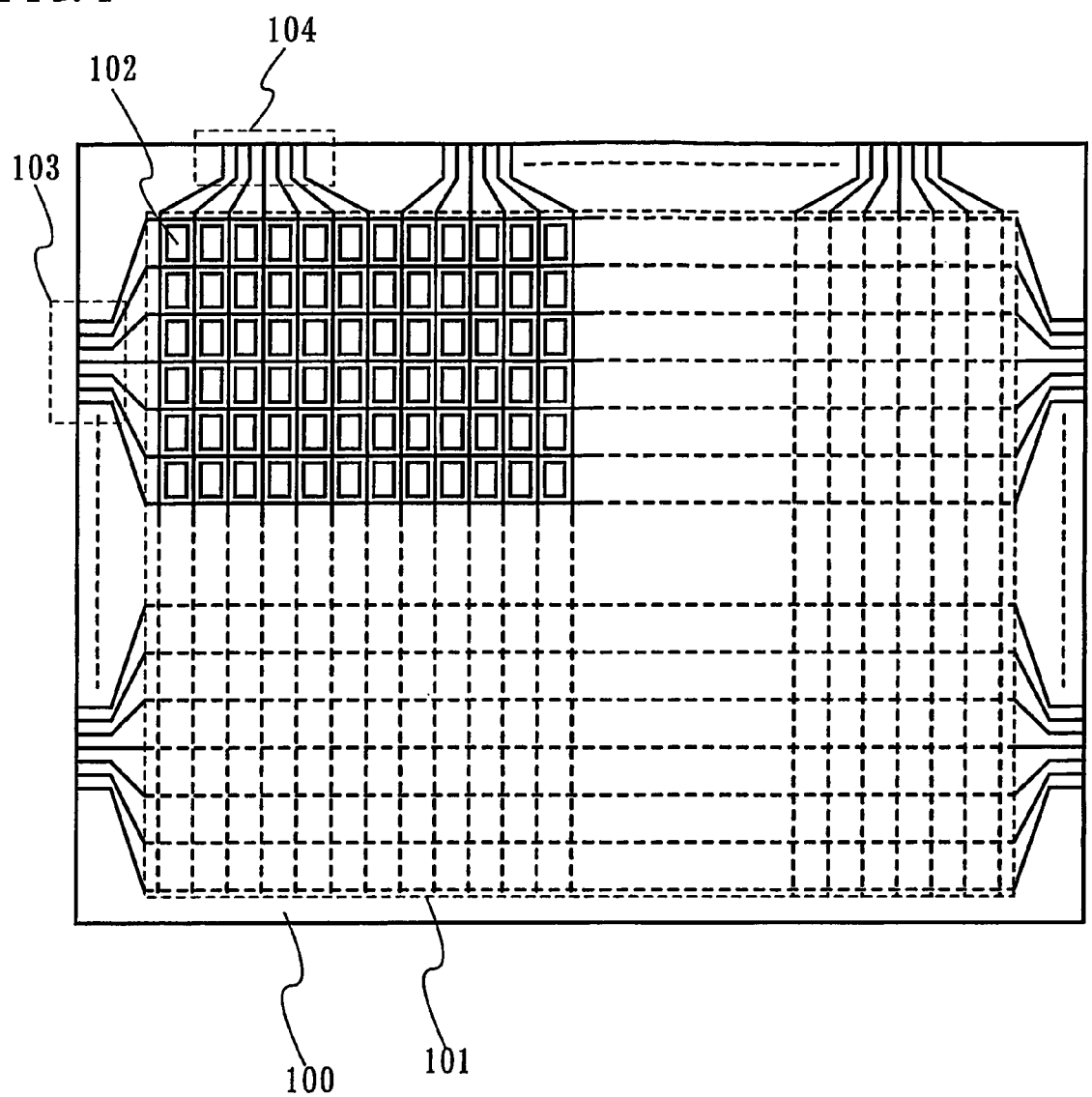
FIG. 1 shows a top view illustrating a structure of an EL display panel according to a certain aspect of the present invention.

Embodiment mode of the present invention will be explained in detail with reference to the drawings. Note that the same reference numerals denote the same parts among each drawing, and the explanation will not be repeated in the following explanations. In addition, it is to be understood that various changes and modifications will be apparent to those skilled in the art, unless such changes and modifications depart from content and the scope of the invention. Therefore, the invention is not interpreted with limiting to the description in this embodiment mode.

FIG. 1 shows a top view of a structure of an EL display panel according to the present invention. A pixel portion 101 in which pixels 102 are arranged in a matrix, a scanning line input terminal 103, and a signal line input terminal 104 are formed on a substrate 100 having an insulating surface. The number of pixels may be provided according to various standards. The number of pixels of XGA may be 1024×768×3 (RGB), that of UXGA may be 1600×1200×3 (RGB), and that of a full-speck high vision to correspond thereto may be 1920×1080×3 (RGB).

The pixels 102 are arranged in a matrix by intersecting a scanning line extended from the scanning line input terminal 103 with a signal line extended from the signal line input terminal 104. Each pixel 102 is provided with a transistor for controlling a connection state between the signal line and a driving transistor (hereinafter, also referred to as a "switching transistor" or a "switching TFT") and a transistor for controlling current flowed through a light-emitting element (hereinafter, also referred to as a "driving transistor" or a "driving TFT"), and the driving transistor is connected in series to the light-emitting element.

A TFT includes a semiconductor layer, a gate insulating layer, and a gate electrode as main components. A wiring connected to a source and drain regions formed in the semiconductor layer is included too. A top gate type in which a semiconductor layer, a gate insulating layer, and a gate electrode are arranged from the substrate side, a bottom gate type in which a gate electrode, a gate insulating layer, and a semiconductor layer are arranged from the substrate side, or the like is known as a structure of a TFT. However, any one of structures may be applied to the invention.

An amorphous semiconductor (hereinafter also refereed to as an "AS") manufactured by using a semiconductor material gas typified by silane or germane with a vapor phase growth method or a sputtering method; a polycrystalline semiconductor that is formed by crystallizing the amorphous semiconductor by utilizing light energy or thermal energy; a semi-amorphous (also referred to as microcrystallite or microcrystalline, and hereinafter also referred to as an "SAS") semiconductor; or the like can be used for a material which forms a semiconductor layer.

An SAS is a semiconductor with an intermediate structure between an amorphous and a crystal structure (including a single crystal and a polycrystal). This is a semiconductor having a third condition that is stable as a case of a free energy, and a crystalline region having a short distance order and lattice distortion is included therein. A crystalline region of from 0.5 nm to 20 nm can be observed at least in a part of region in the film. When silicon is contained as the main component, Raman spectrum is shifted to a lower frequency side less than 520 cm$^{-1}$. Diffraction peak of (111) or (220) to be caused from a crystal lattice of silicon is observed in X-ray diffraction. At least 1 atomic % or more of hydrogen or halogen is contained to terminate a dangling bond. An SAS is formed by carrying out grow discharge decomposition (plasma CVD) on a silicide gas. In addition to $SiH_4$, $Si_2H$, $SiH_2Cl_2$, $SiHCl_3$, $SiCl_4$, $SiF_4$, or the like can be used for the silicide gas. In addition, $GeF_4$ may be mixed. This silicide gas may be diluted with $H_2$ or $H_2$ and one or more of the rare gas element of He, Ar, Kr, and Ne. A dilution ratio ranges from 2 times to 1000 times. A pressure ranges approximately from 0.1 Pa to 133 Pa, and a power frequency ranges from 1 MHz to 120 MHz, preferably from 13 MHz to 60 MHz. A substrate heating temperature may be 300° C. or less. It is desirable that an atmospheric constituent impurity such as oxygen, nitrogen, or carbon is $1 \times 10^{20}$ $cm^{-1}$ or less as an impurity element in the film, specifically an oxygen concentration is $5 \times 10^{19}$/$cm^3$ or less, preferably $1 \times 10^{19}$/$cm^3$ or less.

Figure 2:
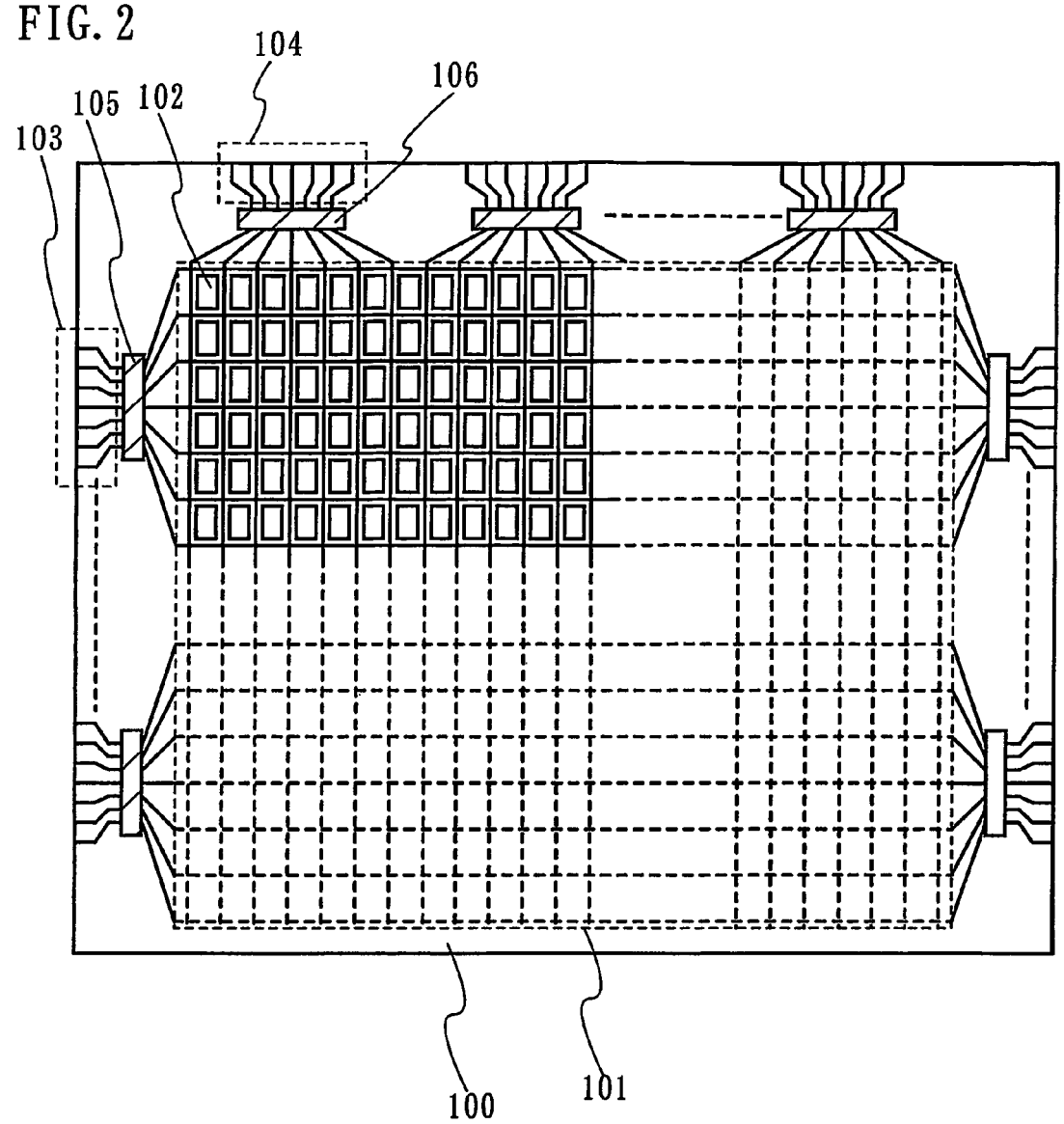
FIG. 2 shows a top view illustrating a structure of an EL display panel according to a certain aspect of the invention.

FIG. 1 shows a structure of an EL display panel that controls a signal inputting into a scanning line and a signal line by an external driver circuit. Furthermore, a driver IC may be mounted on a substrate 100 by a COG (Chip on Glass) as shown in FIG. 2. FIG. 2 shows a mode in which a scanning line driver IC 105 and a signal line driver IC 106 are mounted on the substrate 100. The scanning line driver IC 105 is provided between a scanning line input terminal 103 and a pixel portion 101.

Figure 3:
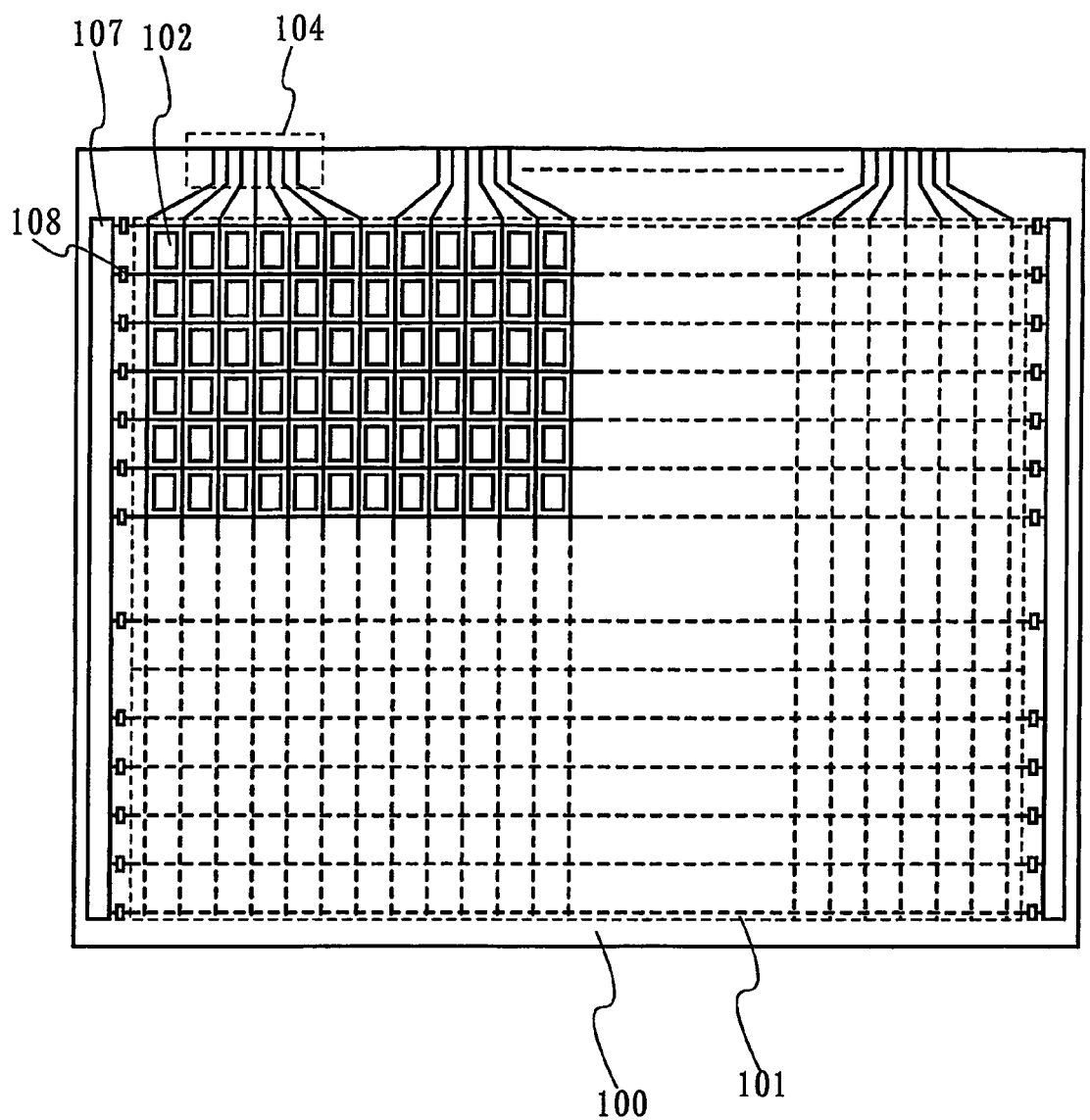
FIG. 3 shows a top view illustrating a structure of an EL display panel according to a certain aspect of the invention.

In addition, a TFT provided for a pixel can be formed from an SAS. Since a TFT using an SAS has an electric field effect mobility of from 1 $cm^2$/V·sec to 15 $cm^2$/V·sec, a driver circuit can be formed. FIG. 3 shows an example of forming a scanning line driver circuit 107. Furthermore, a protective circuit 108 can be also provided between the scanning line driver circuit 107 and a pixel portion 101. The number of input terminals can be reduced by forming the scanning line driver circuit 107 from a TFT on the substrate 100.

Figure 25:
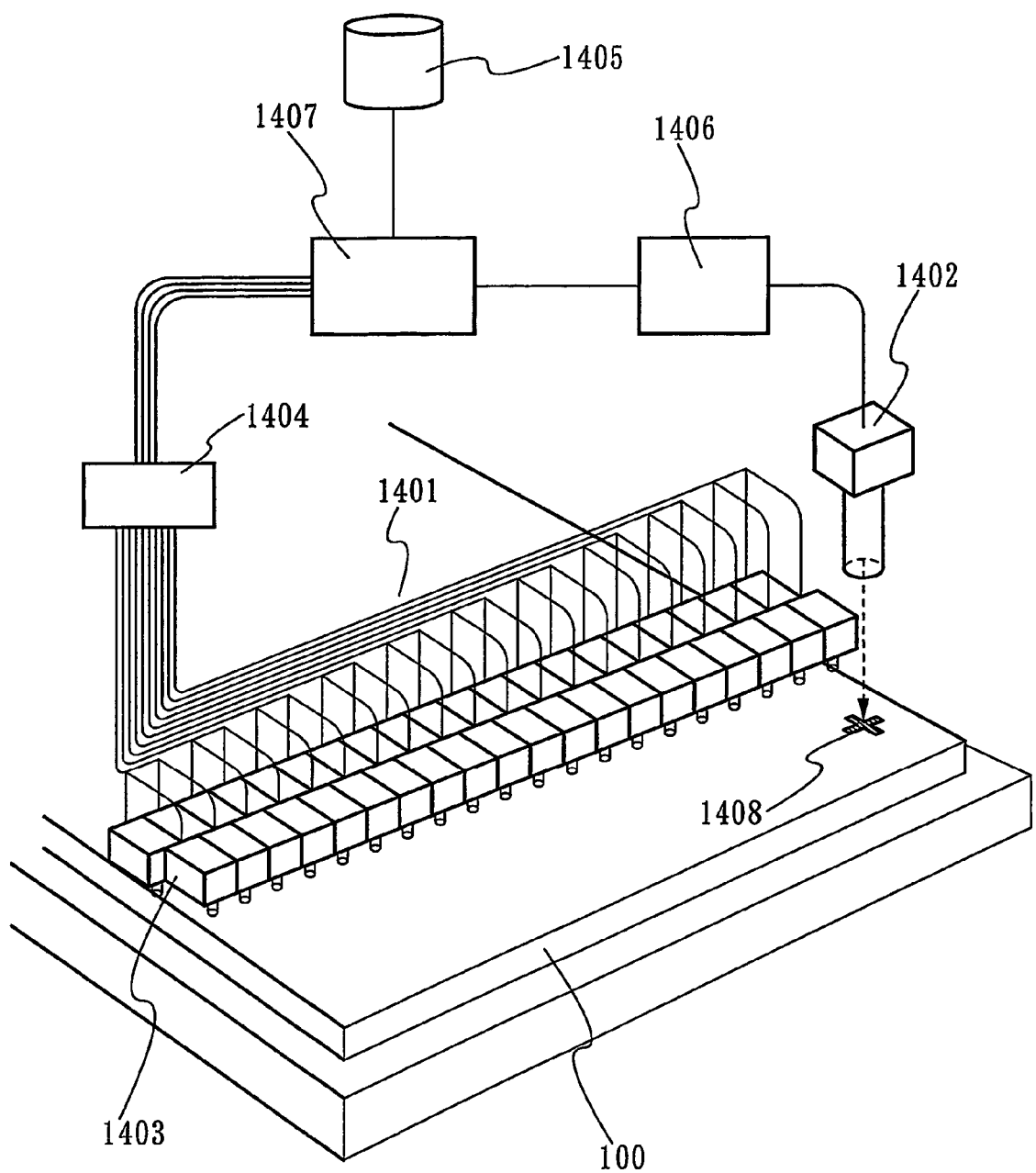
FIG. 25 shows a view illustrating a structure of a droplet discharge device applicable to a certain aspect of the invention.

FIG. 25 shows one mode of a droplet discharge device used for forming patterns. Each head 1403 of a droplet discharge means 1401 is individually connected to a control means 1404. The control means 1404 controls droplet discharge from the head 1403. The timing of discharging droplet is controlled based on the program inputted into a computer 1407. A position of discharging a droplet may be decided based on a marker 1408 formed on a substrate 100 for example. In addition, a reference point may be fixed with an edge of the substrate 100 as a reference. A reference point is detected by an imaging means 1402 such as a CCD, and the computer 1407 recognizes a digital signal converted by an image processing means 1406 to generate a control signal. Of course, information of a pattern to be formed on the substrate 100 is placed in a recording medium 1405. Based on this information, the control signal can be transmitted to the control means 1404 and each head 1403 of the droplet discharge means 1401 can be controlled individually.

Next, a step of manufacturing an EL display panel using such a droplet discharge device is explained hereinafter.

Embodiment Mode 1

A method for manufacturing a channel protective type TFT and a display device with the use thereof are explained in Embodiment mode 1.

Figure 4A:
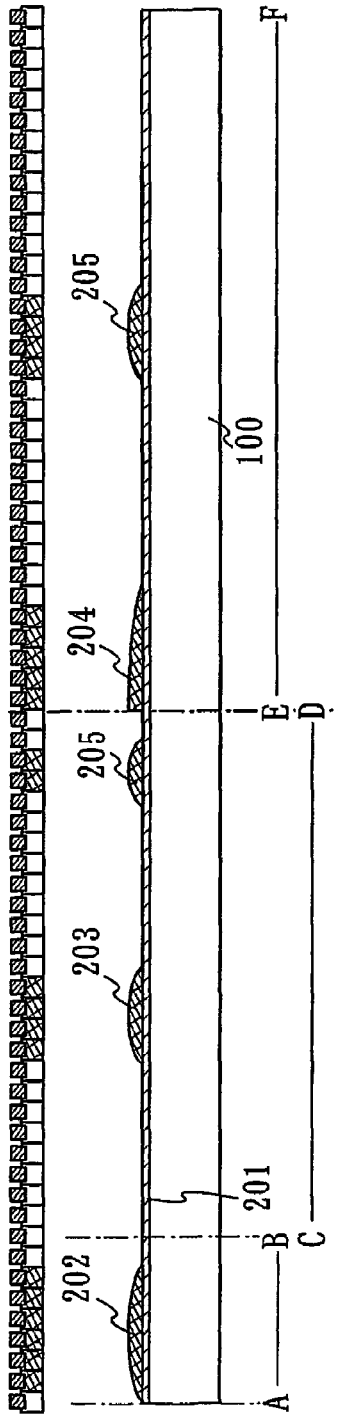
FIGS. 4A to 4C each show cross-sectional views illustrating a step of manufacturing an EL display panel according to certain aspects of the invention.
Figure 8:
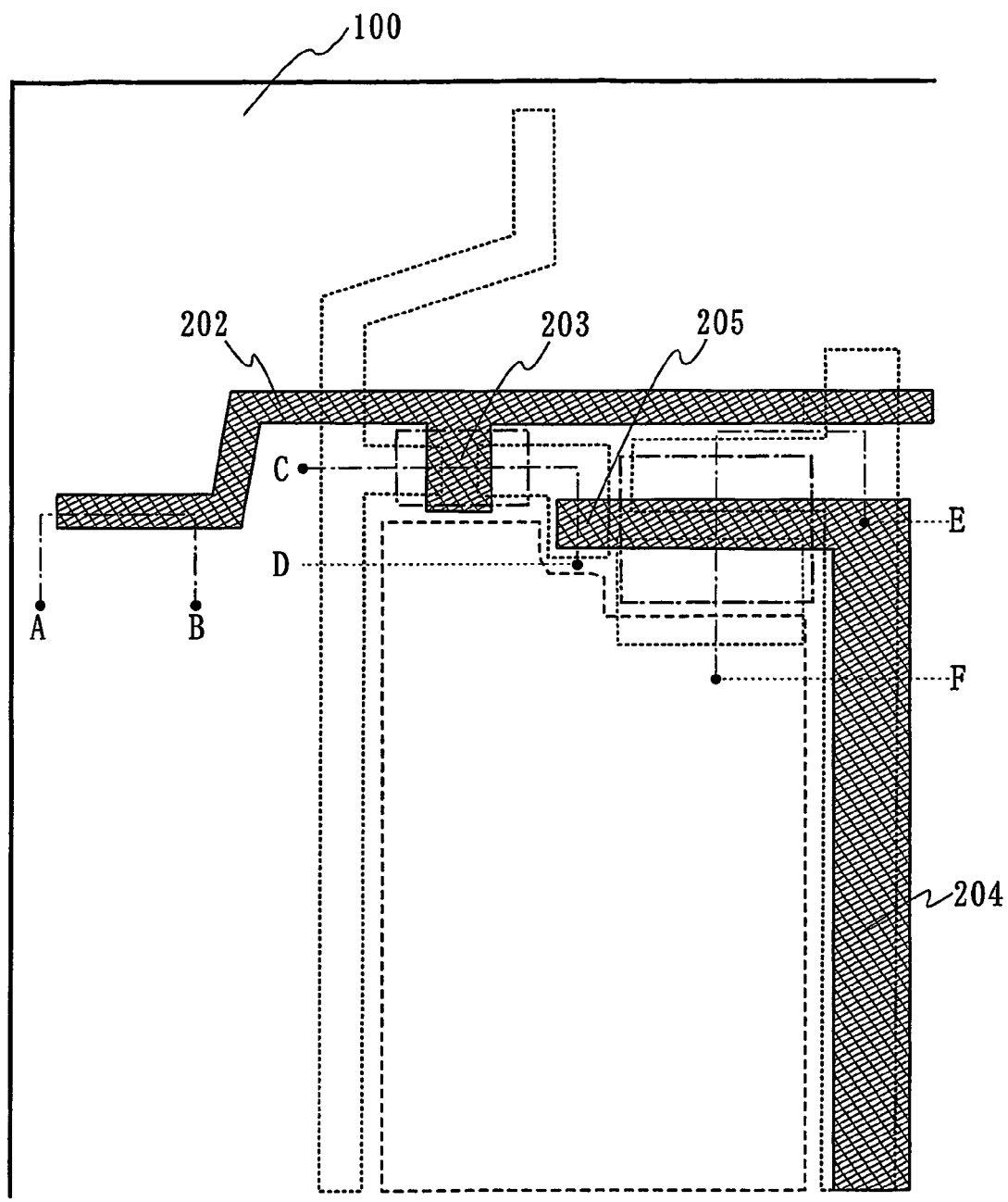
FIG. 8 shows a top view illustrating a step of manufacturing an EL display panel according to a certain aspect of the invention.

FIG. 4A shows a step of forming a gate electrode, and a gate wiring and a capacitor wiring connected to the gate electrode over a substrate 100 with a droplet discharge method. Note that FIG. 4A shows a longitudinal sectional structure, and FIG. 8 shows a planar structure corresponding to A-B and C-D thereof.

In addition to a non-alkaline glass substrate such as barium borosilicate glass, alumino borosilicate glass, or aluminosilicate glass manufactured with a fusion method or a floating method, and a ceramic substrate, a plastic substrate having the heat resistance that can withstand processing temperature or the like can be used for the substrate 100. In addition, a semiconductor substrate such as single crystal silicon, a substrate in which a surface of a metal substrate such as stainless is provided with an insulating layer may be applied too.

A base layer 201 formed from a metal material such as Ti (titanium), W (tungsten), Cr (chromium), Ta (tantalum), Ni (nickel), or Mo (molybdenum) or an oxide thereof is preferably formed on the substrate 100 by a method such as a sputtering method or a vapor deposition method. The conductive layer 201 may be formed to have a film thickness of from 0.01 nm to 10 nm, however, a layer structure is not necessarily needed since it may be formed extremely thin. Note that this base layer 201 is provided to form the gate electrode with good adhesiveness. When adequate adhesiveness is obtained, the gate electrode may be directly formed on the substrate 100 by a droplet discharge method without forming the base layer 201.

A gate wiring 202, a gate electrode 203, a capacitor electrode 204, and a gate electrode 205 are formed on the base layer 201 by discharging a composition containing a conductive material with a droplet discharge method. The composition containing particles of a metal such as Ag (silver), Au (gold), Cu (copper), W (tungsten), or Al (aluminum) as the main component can be used as the conductive material which forms these layers. Specifically, the gate wiring is preferable to be low resistance. Therefore, a material in which any one of gold, silver, or copper dissolved or dispersed in a solvent is preferably used, and more preferably silver or copper with low resistance is used in consideration of a specific resistance value. Since the gate electrode needs to be formed minutely, a nano paste containing particles of which average particle size is from 5 nm to 10 nm is preferably used.

In addition, the gate electrode may be formed by discharging a composition containing particles covered the circumference of a conductive material with other conductive materials. For example, as for particle covered the circumference of Cu with Ag, a conductive particle provided with a buffer layer made from Ni or NiB (nickel boron) between Cu and Ag may be used. A solvent corresponds to esters such as butyl acetate, alcohols such as isopropyl alcohol, an organic solvent such as acetone, or the like. Surface tension and viscosity are appropriately adjusted by adjusting density of a solution and adding a surface activator.

A diameter of a nozzle used in a droplet discharge method is set to be from 0.02 μm to 100 μm (preferably, 30 μm or less), and a discharging amount of a composition discharged from the nozzle is preferably set to be from 0.001 pl to 100 pl (preferably, 10 pl or less). There are two types of an on-demand type and a continuous type for a droplet discharge method, both of which may be used. Furthermore, there is a piezoelectric system using properties transformed by applying voltage pressure of a piezoelectric material and a heating system that boils a composition by a heater provided in a nozzle and discharges the composition for a nozzle to be used in a droplet discharge method, both of which may be used. A distance between a subject and a discharge opening of a nozzle is preferable to be made as close as possible to drop a droplet at a desired place, which is preferably set to be from 0.1 mm to 3 mm (preferably, 1 mm or less). While keeping the relative distance, one of the nozzle and the subject moves and a desired pattern is drawn. In addition, plasma treatment may be carried out on a surface of the subject before discharging a composition. This is to take advantage of a surface of the subject becoming hydrophilic and lyophobic when plasma treatment is carried out. For example, it becomes hydrophilic to deionized water and it becomes lyophobic to a paste dissolved with alcohol.

A step of discharging a composition may be carried out under low pressure so that a solvent of the composition can be volatilized while the composition is discharged and land in a subject and later steps of drying and baking can be skipped or shorten. In a baking step of a composition containing a conductive material, resistivity of a conductive film including the gate electrode can be decreased and the conductive film can be made thin and smoothed by actively using a gas mixed with oxygen of which division ratio is from 10% to 30%.

After discharging a composition, either or both steps of drying and baking is carried out by irradiation of laser light, rapid thermal annealing, heating furnace, or the like under the atmospheric pressure or the low pressure. Both the steps of drying and baling are steps of heat treatment. For example, drying is carried out at 100° C. for 3 minutes and baking is carried out at temperatures from 200° C. to 350° C. for from 15 minutes to 120 minutes. In order to carry out the steps of drying and baking well, a substrate may be heated, of which temperatures are set to be from 100° C. to 800° C. (preferably, temperatures from 200° C. to 350° C.), though depending on a material of a substrate or the like. Through this step, a solvent in a composition is volatilized or dispersant is removed chemically, and a resin around cures and shrink, thereby accelerating fusion and welding. It is carried out under the oxygen atmosphere, the nitrogen atmosphere, or the atmosphere. However, this step is preferable to be carried out under an oxygen atmosphere in which a solvent decomposing or dispersing a metal element is easily removed.

A continuous-wave or pulsed gas laser or solid state laser may be used for irradiation of laser light. There is an excimer laser, or the like as the gas laser, and there is a laser using a crystal such as YAG or YVO$_4$ doped with Cr, Nd, or the like as the solid state laser. It is preferable to use a continuous-wave laser in terms of the laser light absorptance. In addition, a so-called hybrid method of laser irradiation combining a continuous oscillation and a pulsed oscillation may be also used. However, heat treatment by irradiation of laser light may be carried out rapidly from some microseconds to some ten seconds depending on the heat resistance of a substrate. Rapid Thermal Annealing (RTA) is carried out by applying heat rapidly from some microseconds to some minutes by rapidly raising temperature with the use of an infrared lamp that emits light from ultraviolet light to infrared light, a halogen lamp, or the like under the atmosphere of inert gas. This treatment is carried out rapidly; therefore, substantially, only a thin film on an uppermost surface can be heated, and thus, there is advantage that the lower layer is not affected.

A nano paste is a conductive particle, of which particle size is from 5 nm to 10 nm, that is dispersed or dissolved in an organic solvent, and a dispersant or a thermosetting resin referred to as a binder is contained as well. A binder has a function of preventing generation of crack or uneven baked state during baking. According to the drying or baking step, evaporation of the organic solvent, decomposition and removal of the dispersant, and hardening shrinkage by a binder are carried out simultaneously; therefore, nanoparticles makes fusion and/or welding with each other to be hardened. In this case, the nanoparticles is grown from several tens nm to several hundreds nm. The grown particles close to each other makes fusion and/or welding to connect in chain with each other to form a metal chain body. On the other hand, almost all remaining organic component (approximately from 80% to 90%) is pushed to outside of the metal chain body. As a result, a conductive film containing the metal chain body and a film made from an organic component covering the outside of the conductive film are formed. In addition, oxygen contained in a gas is reacted with carbon, hydrogen, or the like contained in the film made from an organic component when a nano paste is baked under the atmosphere containing nitrogen and oxygen; therefore, the film made from an organic component can be removed.

In addition, when oxygen is not contained in the baking atmosphere, the film made from an organic component can be removed by additionally carrying out oxygen plasma treatment or the like. In this manner, the film made from an organic component is removed by baking a nano paste under the atmosphere containing nitrogen and oxygen or by carrying out oxygen plasma treatment after drying. Therefore, the conductive film containing the remaining metal chain body can be made smoothed, thin, or reduced in resistance since the film made from an organic component is removed. A solvent in a composition containing a conductive material volatilizes by discharging the composition under the low pressure; therefore, the time for subsequent heat treatment (drying or baking) can be shortened.

After forming the gate wiring 202, the gate electrode 203, the capacitor electrode 204, and the gate electrode 205, it is desirable to carry out one of the following two steps as treatment of the base layer 201 of which surface is exposed.

Figure 4B:
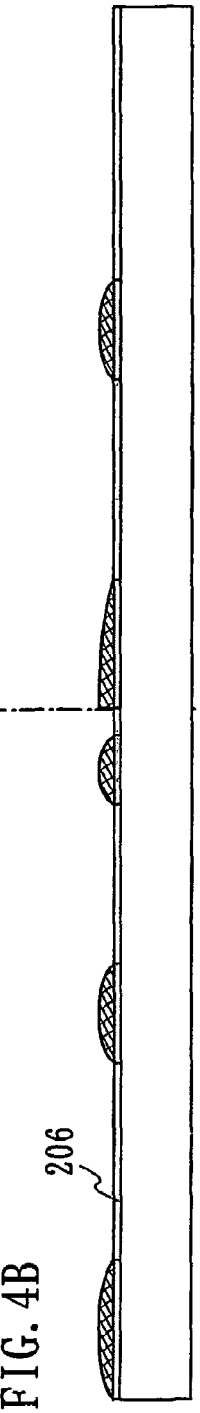

A first method is a step of forming an insulating layer 206 by insulating the base layer 201 not overlapping with the gate wiring 202, the gate electrode 203, the capacitor electrode 204, and the gate electrode 205 (see FIG. 4B). In other words, the base layer 201 not overlapping with the gate wiring 202, the gate electrode 203, the capacitor electrode 204, and the gate electrode 205 are oxidized to be insulated. In the case of insulating the base layer 201 by oxidizing in this manner, the base layer 201 is preferably formed to have a film thickness of from 0.01 nm to 10 nm, so that it can be easily oxidized. Note that either an exposing method to the oxygen atmosphere or a method for carrying out heat treatment may be used as an oxidizing method.

A second method is a step of etching and removing the base layer 201, using the gate wiring 202, the gate electrode 203, the capacitor electrode 204, and the gate electrode 205 as the masks. In the case of using this step, there is no restriction on a film thickness of the base layer 201.

Figure 4C:
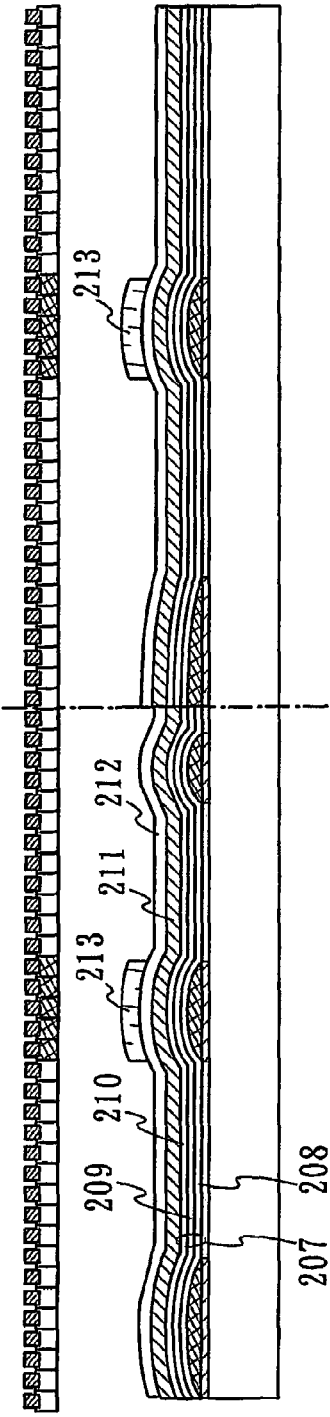

Next, a gate insulating layer 207 is formed in a single layer or a laminated structure by using a plasma CVD method or a sputtering method (see FIG. 4C). As a specifically preferable mode, a lamination body of three layers of a first insulating layer 208 made from silicon nitride, a second insulating layer 209 made from silicon oxide, and a third insulating layer 210 made from silicon nitride is composed as the gate insulating film. Note that a rare gas such as argon may be contained in a reactive gas and mixed into an insulating film to be formed in order to form a dense insulating film with little gate leak current at a low deposition temperature. Deterioration by oxidation can be prevented by forming the first insulating layer 208 being in contact with the gate wiring 202, the gate electrode 203, the capacitor electrode 204, and the gate electrode 205 preferably from silicon nitride or silicon nitride oxide.

Next, a semiconductor layer 211 is formed. The semiconductor layer 211 is formed from an AS manufactured with a vapor phase growth method or a sputtering method by using a semiconductor material gas typified by silane or germane or from an SAS. A plasma CVD method or a thermal CVD method can be used as a vapor phase growth method.

In the case of using a plasma CVD method, an AS is formed from $SiH_4$ which is a semiconductor material gas or a mixed gas of $SiH_4$ and $H_2$. When $SiH_4$ is diluted with $H_2$ by from 3 times to 1000 times to make a mixed gas or when $Si_2H_6$ is diluted with $GeF_4$ so that a gas flow rate of $Si_2H_6$ to $GeF_4$ is from 20 to 40 to 0.9, an SAS of which Si composition ratio is 80% or more can be obtained. Specifically, the latter case is preferable since the semiconductor layer 211 can have crystallinity from an interface with the third insulating layer.

An insulating layer 212 is formed on the semiconductor layer 211 by a plasma CVD method or a sputtering method. As shown in the following steps, this insulating layer 212 is left on the semiconductor layer 211 being opposed to the gate electrode and serves as a channel protective layer. The semiconductor layer 211 is preferably formed of a dense film in order to prevent external impurities such as metal or an organic material and to keep clean an interface between the insulating layer 212 and the semiconductor layer 211. It is desirable that this insulating layer 212 can be formed at low temperature. For example, in a glow discharge decomposition method, a silicon nitride film which is formed by diluting a silicide gas by from 100 times to 500 times with a rare gas such as argon is preferable since the dense film can be formed even at a deposition temperature of 100° C. or less.

It is possible to continuously form the gate insulating layer 207 to the insulating layer 212 without exposing to the atmosphere. In other words, each interface between laminated layers can be formed without being contaminated by an atmospheric constituent and an airborne contaminated impurity element that is floated in an atmosphere; therefore, variations in properties of a TFT can be decreased.

Next, a mask 213 is formed by selectively discharging a composition at a position that is opposed to the gate electrode 203 and the gate electrode 205 and that is on the insulating layer 212 (see FIG. 4C). A resin material such as an epoxy resin, an acrylic resin, a phenol resin, a novolac resin, a melamine resin, or a urethane resin is used for the mask 213. In addition, the mask 213 is formed with a droplet discharge method by using an organic material such as benzocyclobutene, parylene, flare, or light-transmitting polyimide; a compound material made from polymerization such as siloxane-based polymer; a composition material containing water-soluble homopolymer and water-soluble copolymer; or the like. Alternatively, a commercial resist material containing a photosensitizer may be used. For example, a typical positive type resist comprising a novolac resin and naphthoquinonediazide compound that is a photosensitizer, a negative type resist comprising a base resin, diphenylsilane diol, and an acid generation agent, or the like may be used. In using any one of materials, surface tension and viscosity are appropriately adjusted by diluting density of a solution or adding a surface activator or the like.

The insulating layer 212 is etched by using the mask 213 as shown in FIG. 4C, and an insulating layer 214 functioning as a channel protective layer is formed (see FIG. 5A). An n-type semiconductor layer 215 is formed over the semiconductor layer 211 and the insulating layer 214 by removing the mask 213. The n-type semiconductor layer 215 may be formed by using a silane gas and a phosphine gas and can be formed from an AS or an SAS.

Figure 9:
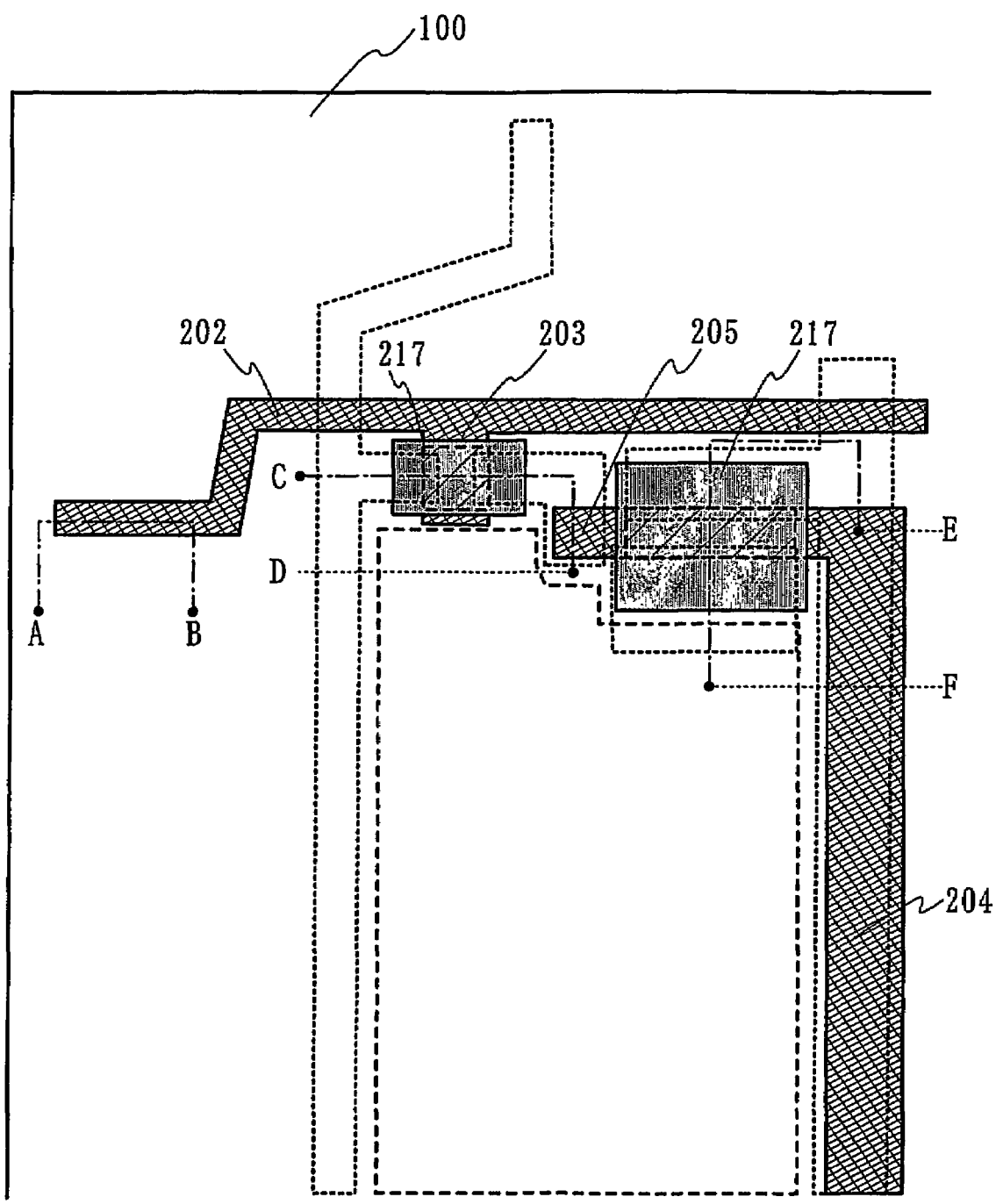
FIG. 9 shows a top view illustrating a step of manufacturing ad EL display panel according to a certain aspect of the invention.

Next, a mask 216 is formed with a droplet discharge method on the n-type semiconductor layer 215. By using this mask 216, the n-type semiconductor layer 215 and the semiconductor layer 211 are etched, and a semiconductor layer 217 and an n-type semiconductor layer 218 are formed (see FIG. 5B). Note that FIG. 5B schematically shows a longitudinal sectional structure, and FIG. 9 shows a planar structure corresponding to A-B and C-D thereof.

Next, a through hole 219 is formed in a part of the gate insulating layer 207 by an etching process, and the gate electrode 205 disposed in the lower layer thereof is partially exposed (see FIG. 5C). The etching process may be carried out by forming the same mask as the above with a droplet discharge method. Either plasma etching or wet etching may be applied for the etching process. Plasma etching is appropriate for processing a large-sized substrate. A fluorine-based or chlorine-based gas such as $CF_4$, $NF_3$, $Cl_2$, or $BCl_3$ is used for an etching gas, and He or Ar may be added appropriately. In addition, when an etching process of atmospheric pressure discharge is applied, a local discharge process is also possible; therefore, there is no necessity to form a mask over an entire surface of a substrate.

Figure 6A:
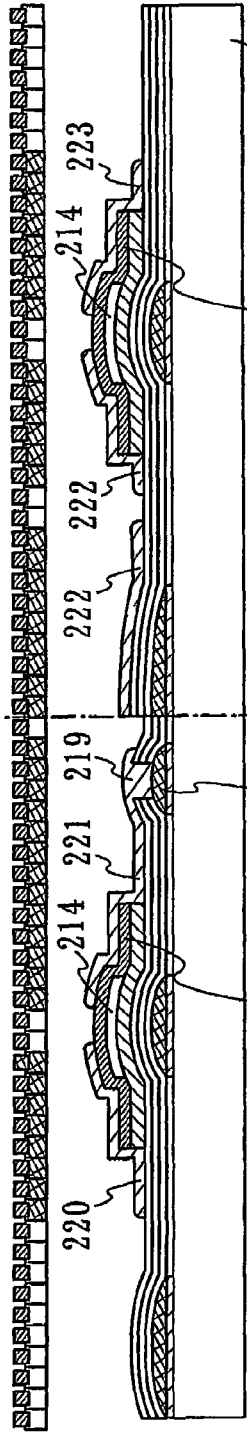
FIGS. 6A to 6C each show cross-sectional views illustrating a step of manufacturing an EL display panel according to certain aspects of the invention.
Figure 10:
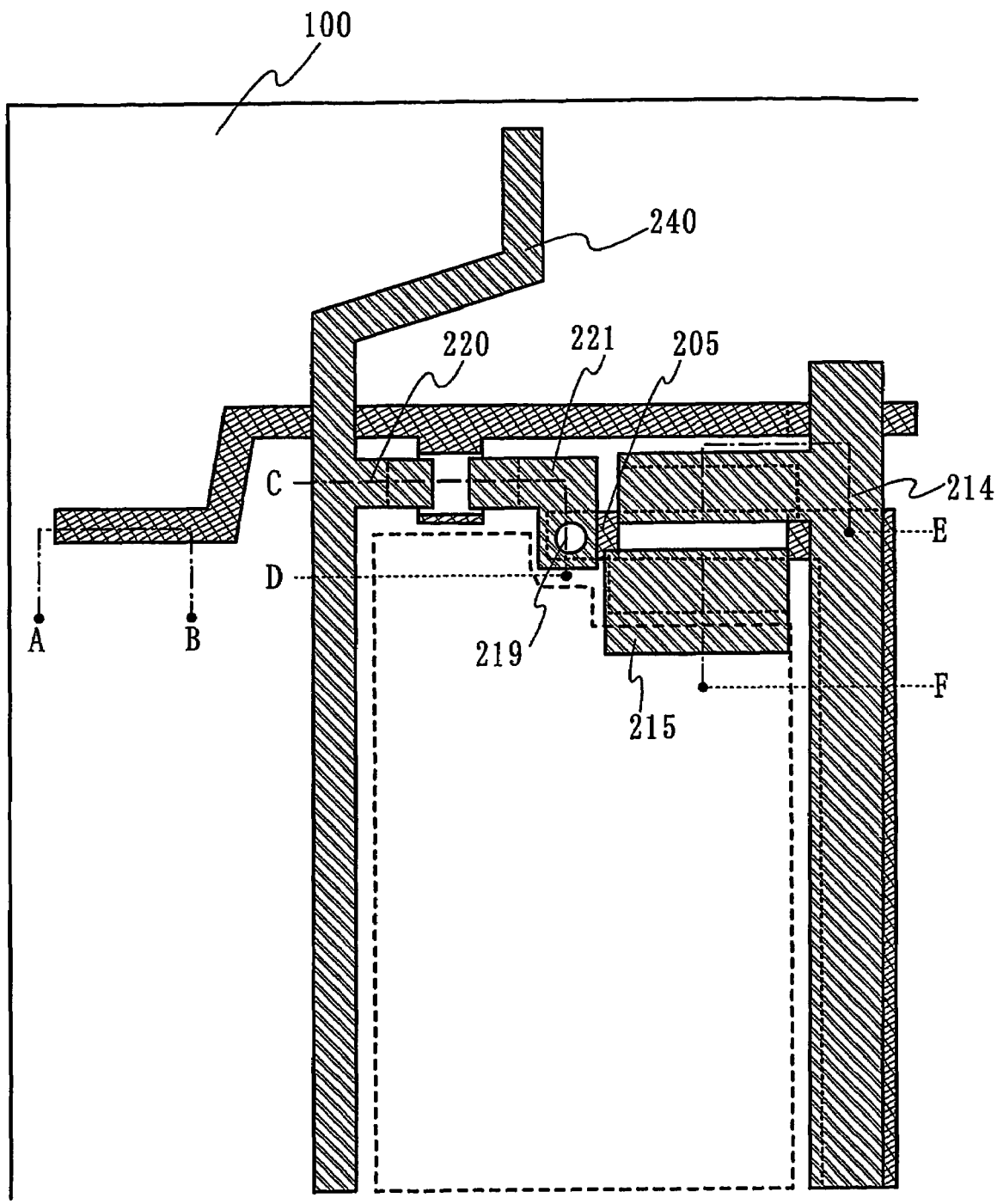
FIG. 10 shows a top view illustrating a step of manufacturing an EL display panel according to a certain aspect of the invention.

Subsequently, wirings 220, 221, 222, and 223 connected to a source and a drain are formed with a droplet discharge method by selectively discharging a composition containing a conductive material (see FIG. 6A). FIG. 6A shows a longitudinal sectional structure, and FIG. 10 shows a planar structure corresponding to A-B and C-D shown in FIG. 6A. As shown in FIG. 10, a wiring 240 extending from one end of a substrate 100 is simultaneously formed. This is provided to electrically connect to a wiring 220. In addition, as shown in FIG. 6A, the wiring 221 and the gate electrode 205 are electrically connected in the through hole 219 formed in the gate insulating layer 207. A composition containing particles of a metal such as Ag (silver), Au (gold), Cu (copper), W (tungsten), or Al (aluminum) as the main component can be used as a conductive material which forms this wiring. Furthermore, light-transmitting indium tin oxide (hereinafter also referred to as an "ITO"), indium tin oxide containing silicon oxide (hereinafter also referred to as an "ITSO"), organic indium, organotin, zinc oxide, titanium nitride, and the like may be combined.

Figure 6B:
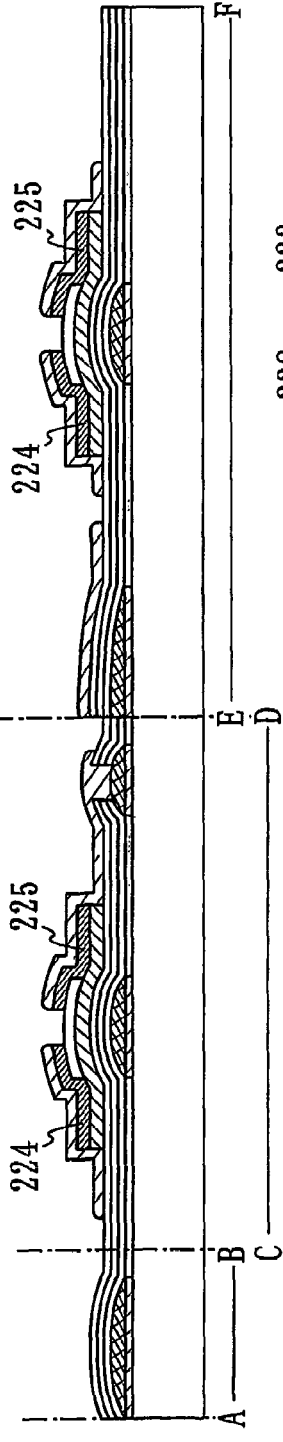

Next, using the wirings 220, 221, 222, and 223 as the masks, n-type semiconductor layers 224 and 225 which forms source and drain regions are formed by etching the n-type semiconductor layer 218 on the insulating layer 214 (see FIG. 6B).

Figure 6C:
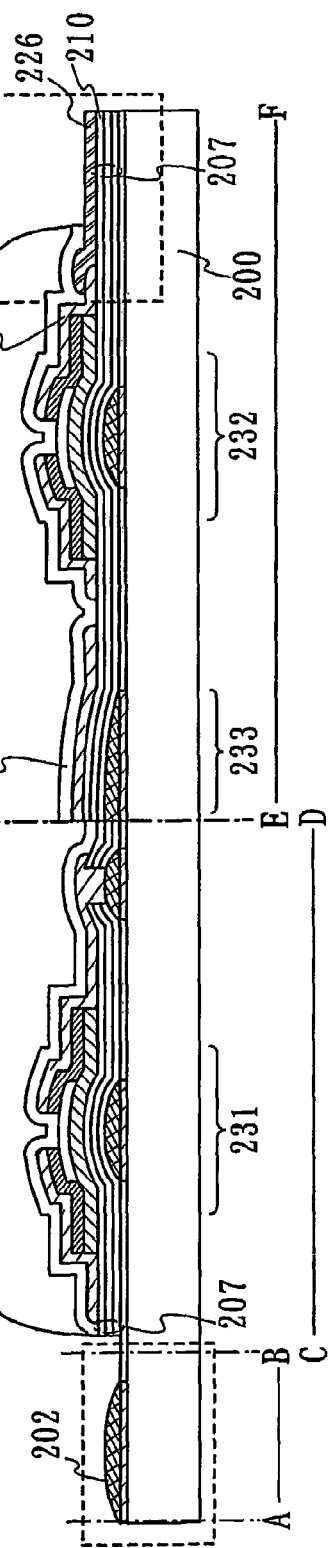
Figure 11:
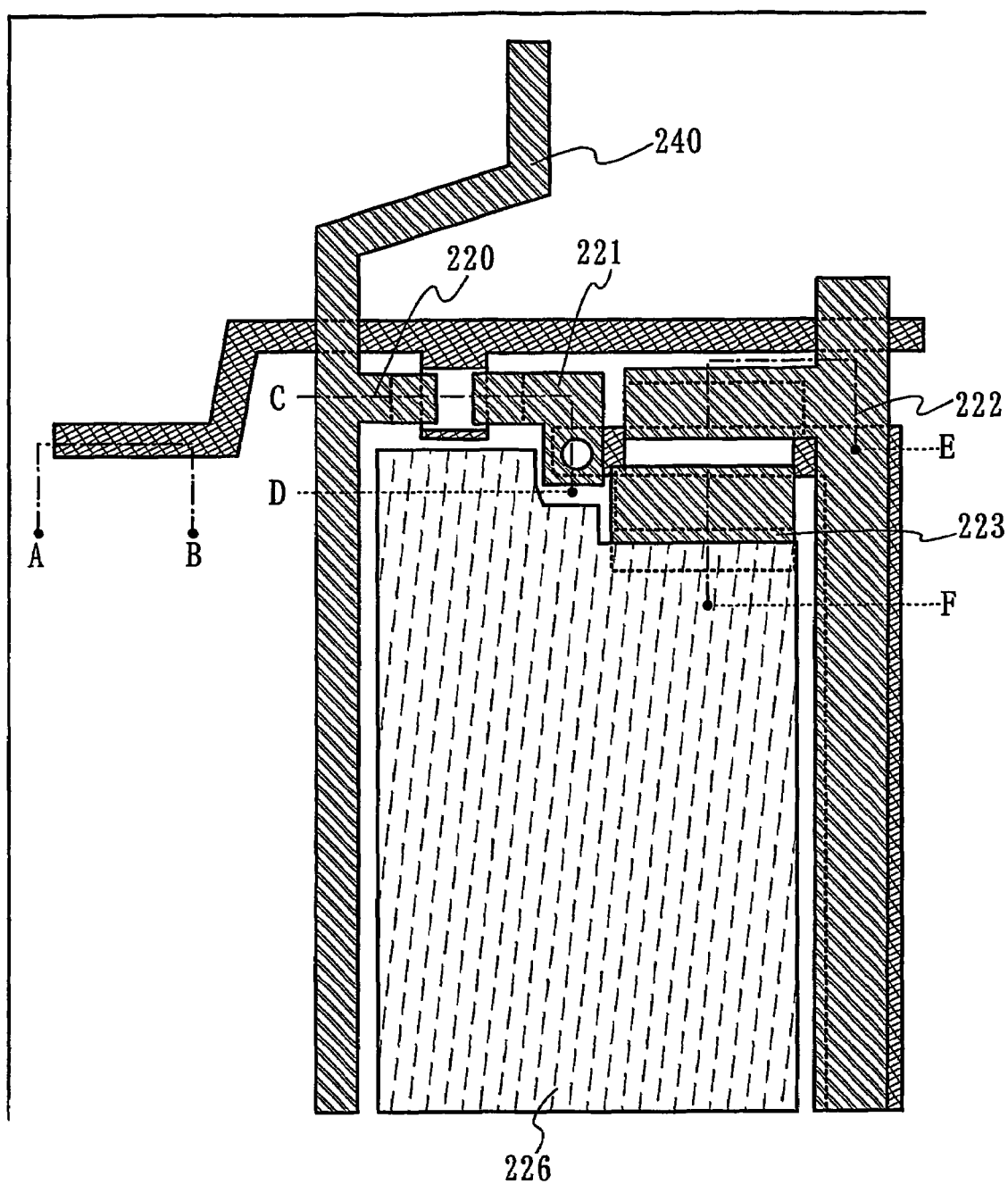
FIG. 11 shows a top view illustrating a step of manufacturing an EL display panel according to a certain aspect of the invention.

A first electrode 226 corresponding to a pixel electrode is formed by selectively discharging a composition containing a conductive material so that it is electrically connected to the wiring 223 (see FIG. 6C). Note that FIG. 6C shows a longitudinal sectional structure and FIG. 11 shows a planar structure corresponding to A-B and C-D thereof. Through above-mentioned steps, switching TFT 231, a driving TFT 232, and a capacitor portion 233 are formed.

This first electrode 226 is formed by using a droplet discharge method. In the case of manufacturing a transmission type EL display panel, a composition containing indium tin oxide (ITO), indium tin oxide containing silicon oxide (ITSO), zinc oxide, tin oxide, or the like may be used for the first electrode 226. Then, a predetermined pattern may be formed and a pixel electrode may be formed by baking.

The first electrode 226 is formed from indium tin oxide (ITO), indium tin oxide containing silicon oxide (ITSO), zinc oxide (ZnO), or the like by a sputtering method. More preferably, indium tin oxide containing silicon oxide is used with a sputtering method by using a target in which 2 wt. % to 10 wt. % of silicon oxide is contained in ITO. Moreover, conductive oxide containing silicon oxide and in which 2 wt. % to 20 wt. % of zinc oxide is mixed with indium oxide (hereinafter, also referred to as "IZO") may be used.

The first electrode 226 formed from indium tin oxide containing silicon oxide is formed very close to the third insulating layer 210 made from silicon nitride contained in the gate insulating layer 207. This structure can decrease the loss of light when light is radiated on the side of the substrate 100 through the first electrode 226.

In addition, a composition containing particles of a metal such as Ag (silver), Au (gold), Cu (copper), W (tungsten), or Al (aluminum) can be used for the first electrode 226 in the case of a structure in which light is radiated on the side opposite to the substrate 100.

Furthermore, a protective layer 227 of silicon nitride or silicon nitride oxide and an insulating layer 228 are entirely formed. An insulator that can be formed by an application method such as a spin coating method or a dip method may be applied to the insulating layer 228; The protective layer 227 and the insulating layer 228 are formed to cover the edge of the first electrode 226. A structure of the protective layer 227 and the insulating layer 228 shown in FIG. 6C can be formed by an etching process, and thus, the surface of the first electrode 226 is exposed. The first electrode 226 and the gate wiring 202 are processed to be exposed by this etching by simultaneously etching the protective layer 227 in the lower layer of the insulating layer 228 and the gate insulating layer 207.

The insulating layer 228 is formed by providing an opening having a through hole in accordance with a position where a pixel is formed by corresponding to the first electrode 226. This insulating layer 228 can be formed from an inorganic insulating material such as silicon oxide, silicon nitride, silicon oxynitride, aluminum oxide, aluminum nitride, aluminum oxynitride, or the like; acrylic acid, methacrylic acid, and a derivative thereof; a high molecular weight material having heat resistance such as polyimide, aromatic polyamide, or polybenzimidazole; inorganic siloxane including a Si—O—Si bond, among the compound made from silicon, oxygen, and hydrogen, formed by using a siloxane-based material as a start material; or an organic siloxane insulating material in which hydrogen over silicon is substituted by an organic group such as methyl or phenyl. When the insulating layer 228 is formed from a photosensitive material or a non-photosensitive material such as acrylic or polyimide, it is preferable since the edge thereof has a shape in which a curvature radius changes continuously and a thin film in the upper layer is formed without a step disconnection.

Through the above-mentioned steps, a TFT substrate 200 for an EL display panel in which a bottom gate type (also referred to as a reverse stagger type) TFT and the first electrode are connected over the substrate 100 is completed.

Figure 7:
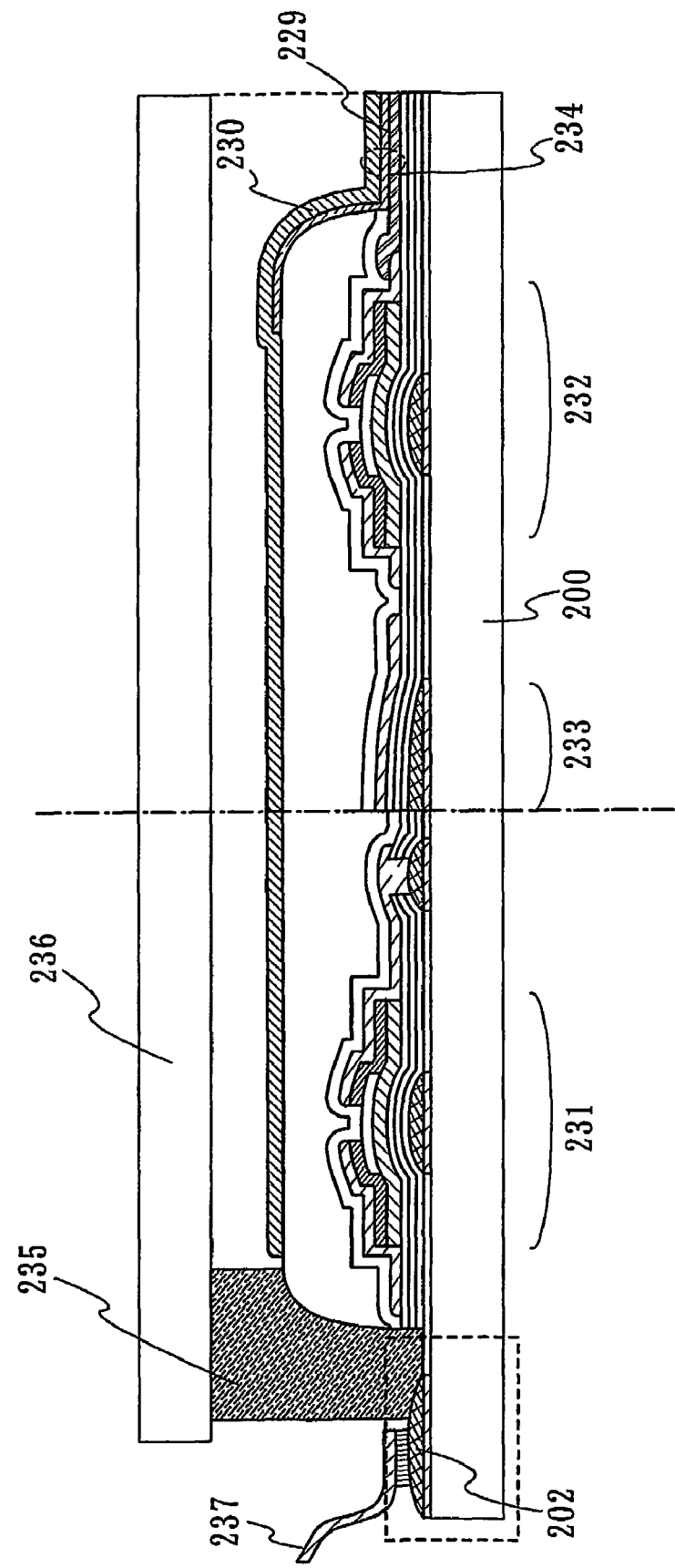
FIG. 7 shows a cross-sectional view illustrating a step of manufacturing an EL display panel according to a certain aspect of the invention.

FIG. 7 shows a mode in which an EL layer 229 is formed over the TFT substrate 200 and combined with a sealing substrate 236. Before forming the EL layer 229, heat treatment at 100° C. or more under the atmospheric pressure is carried out to remove the moisture adsorbed in the insulating layer 228 or on the surface thereof. In addition, heat treatment is carried out at temperatures from 200° C. to 400° C., preferably from 250° C. to 350° C. under the low pressure. It is preferable to form the EL layer 229 with a vacuum vapor deposition method or a droplet discharge method under the low pressure without exposing to the atmosphere.

In addition, surface treatment may be additionally carried out by exposing the surface of the first electrode 226 to oxygen plasma or irradiating it with ultraviolet light. A second electrode 230 is formed on the EL layer 229 to form a light-emitting element 234. This light-emitting element 234 has a structure in which it is connected to the driving TFT 232.

Subsequently, a sealant 235 is formed and sealed by using the sealing substrate 236. Thereafter, a flexible wiring board 237 may be connected to the gate wiring 202 (see FIG. 7).

As mentioned above, in this embodiment mode, a display device combining light-emitting elements can be manufactured by manufacturing a TFT without using a light-exposure step using a photomask. A part or all of the treatment such as application of a resist, light-exposure, or development according to the light-exposure step can be skipped. In addition, an EL display panel can be easily manufactured even by using a glass substrate after five generations, one side of which exceeds 1000 mm by forming each kind of pattern directly on a substrate by using a droplet discharge method.

Embodiment Mode 2

A method for manufacturing a channel etch type TFT and a display device with the use thereof are explained in Embodiment Mode 2.

A gate wiring 202, a gate electrode 203, a capacitor electrode 204, and a gate electrode 205 are formed over a substrate 100 by discharging a composition containing a conductive material by a droplet discharge method. Next, a gate insulating layer 207 is formed to have a single layer structure or a laminated structure by a plasma CVD method or a sputtering method. The gate insulating layer 207 may be formed from silicon nitride or silicon oxide in the same manner as Embodiment Mode 1. Furthermore, a semiconductor layer 211 functioning as an active layer is formed. The above-mentioned steps are the same as those in Embodiment Mode 1.

Figure 12A:
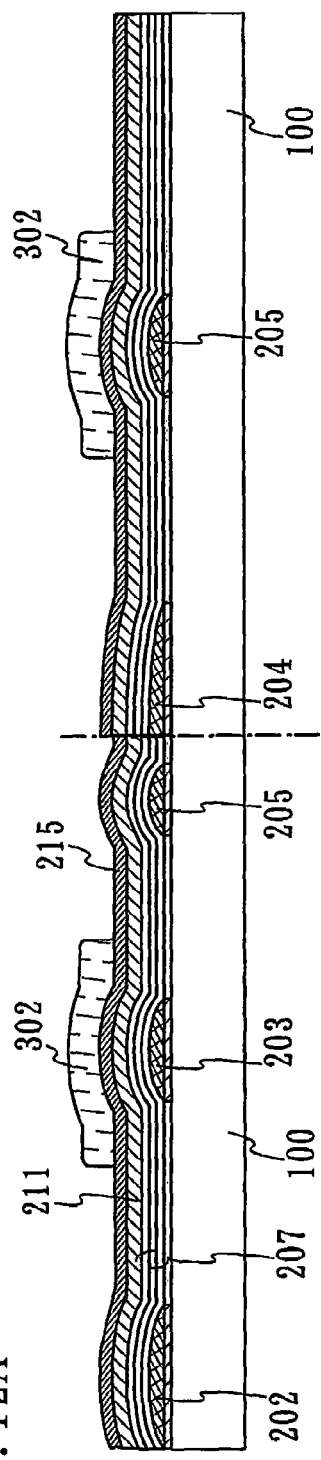
FIGS. 12A to 12C each show cross-sectional views illustrating a step of manufacturing an EL display panel according to certain aspects of the invention.

An n-type semiconductor layer 215 is formed on the semiconductor layer 211 (see FIG. 12A). Next, a mask 302 is formed by selectively discharging a resist composition on the n-type semiconductor layer 215. Subsequently, the semiconductor layer 211 and the n-type semiconductor layer 215 are etched by using the mask 302.

Figure 12B:
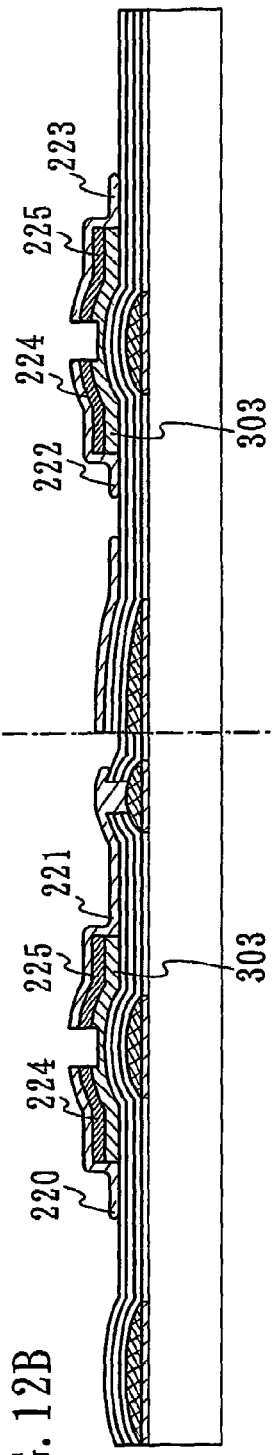

Wirings 220, 221, 222, and 223 are formed by discharging a composition containing a conductive material in accordance with a disposition of the semiconductor layers separated by etching. The n-type semiconductor layer is etched by using the wirings as the masks. N-type semiconductor layers 224 and 225 left on a part overlapping with the wirings 220, 221, 222, and 223 serve as layers including a region operating as a source or a drain. A semiconductor layer 303 includes a region where a channel is formed and is formed to be in contact with the n-type semiconductor layers 224 and 225. As well as in Embodiment Mode 1, a through hole 219 is formed in a part of the gate insulating layer 207 and a step of partially exposing the gate electrode 205 disposed in the lower layer side is carried out before this etching process. Accordingly, a connection structure of the wiring 221 and the gate electrode 205 can be formed (see FIG. 12B).

Figure 12C:
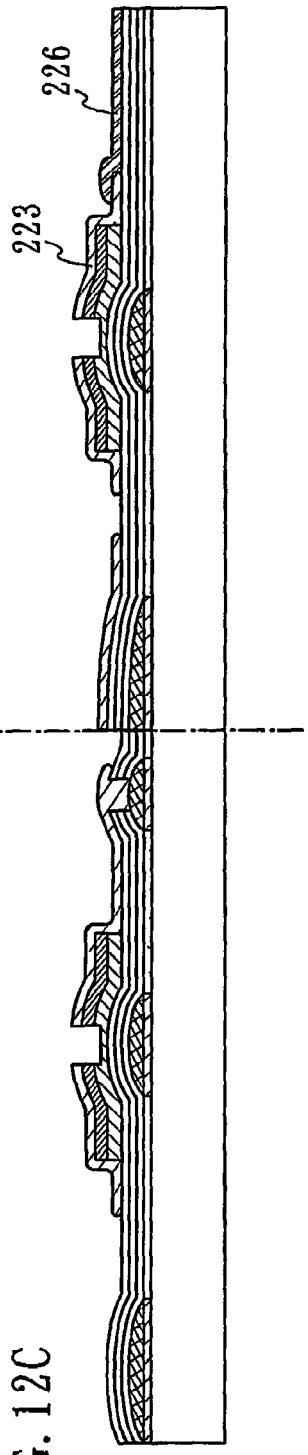

Subsequently, a first electrode 226 is formed by discharging a composition containing a conductive material to electrically connect to the wiring 223 (see FIG. 12C).

Figure 13:
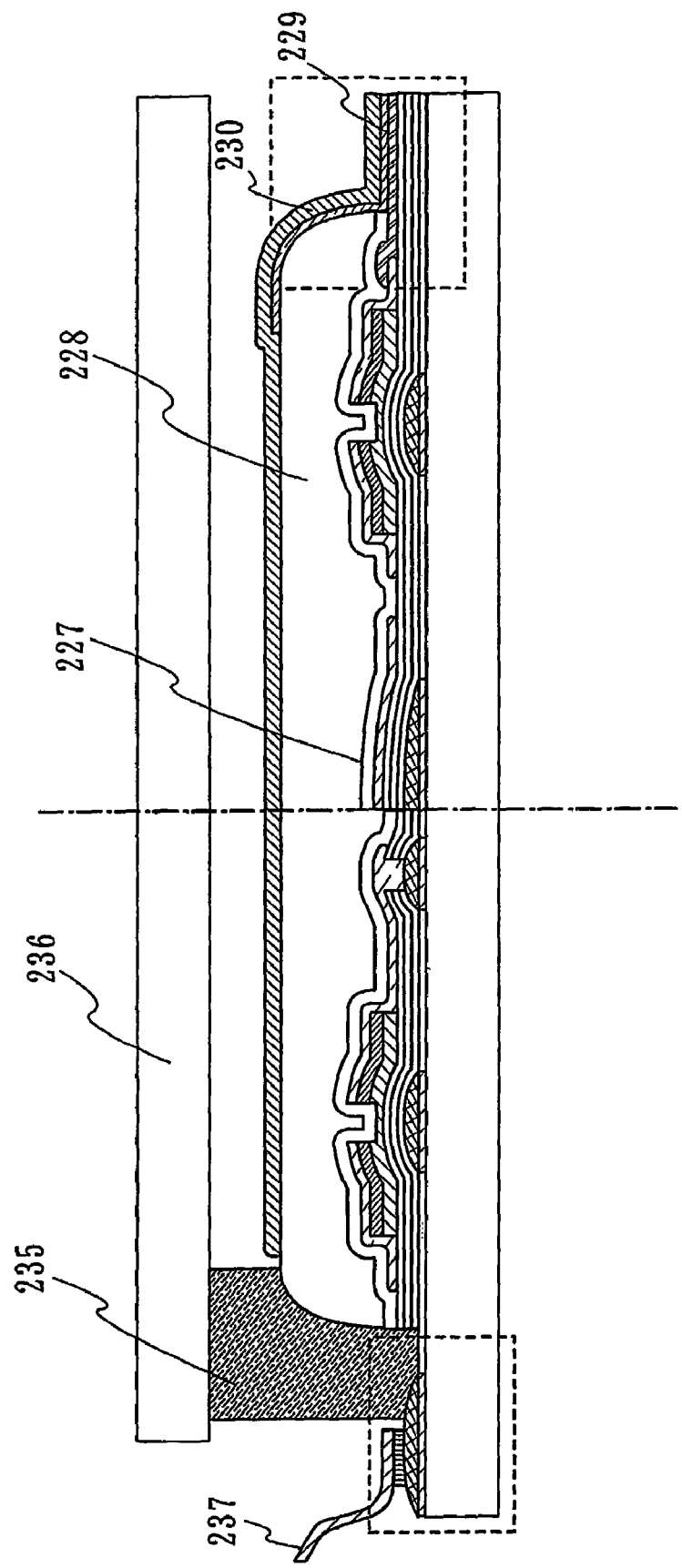
FIG. 13 shows a cross-sectional view illustrating a step of manufacturing an EL display panel according to a certain aspect of the invention.

Thereafter, as well as in Embodiment Mode 1, a protective layer 227, an insulating layer 228, an EL layer 229, and a second electrode 230 are formed. Furthermore, a sealant 235 is formed and sealed by using a sealing substrate 236. Thereafter, a flexible wiring board 237 may be connected to the gate wiring 202. As mentioned above, an EL display panel having a display function can be manufactured (see FIG. 13).

Embodiment Mode 3

In an EL display panels manufactured by Embodiment Mode 1 and Embodiment Mode 2, as explained in FIG. 3, a scanning line driver circuit can be formed on a substrate 100 by forming a semiconductor layer from an SAS.

Figure 22:
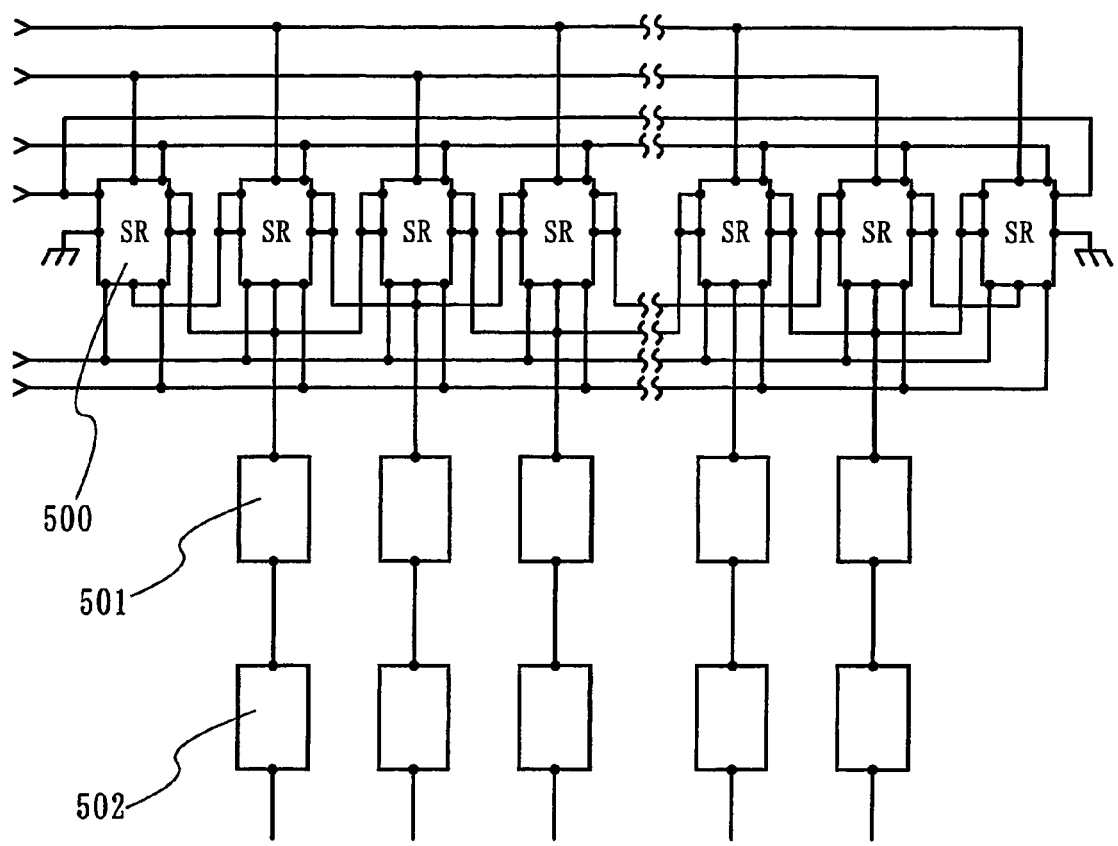
FIG. 22 shows a diagram illustrating a circuit structure in the case of forming a scanning line driver circuit with a TFT in an EL display panel according to a certain aspect of the invention.

FIG. 22 shows a block diagram of the scanning line driver circuit composed of n-channel type TFTs using the SAS in which electric field effect mobility of from 1 cm$^2$/V·sec to 15 cm$^2$/V·sec is obtained.

In FIG. 22, a pulse output circuit 500 is a circuit outputting a sampling pulse for one stage and includes a shift register. The pulse output circuit 500 is connected to a buffer circuit 501 and connected to a pixel 502 (corresponds to a pixel 102 in FIG. 3) at the end thereof.

Figure 23:
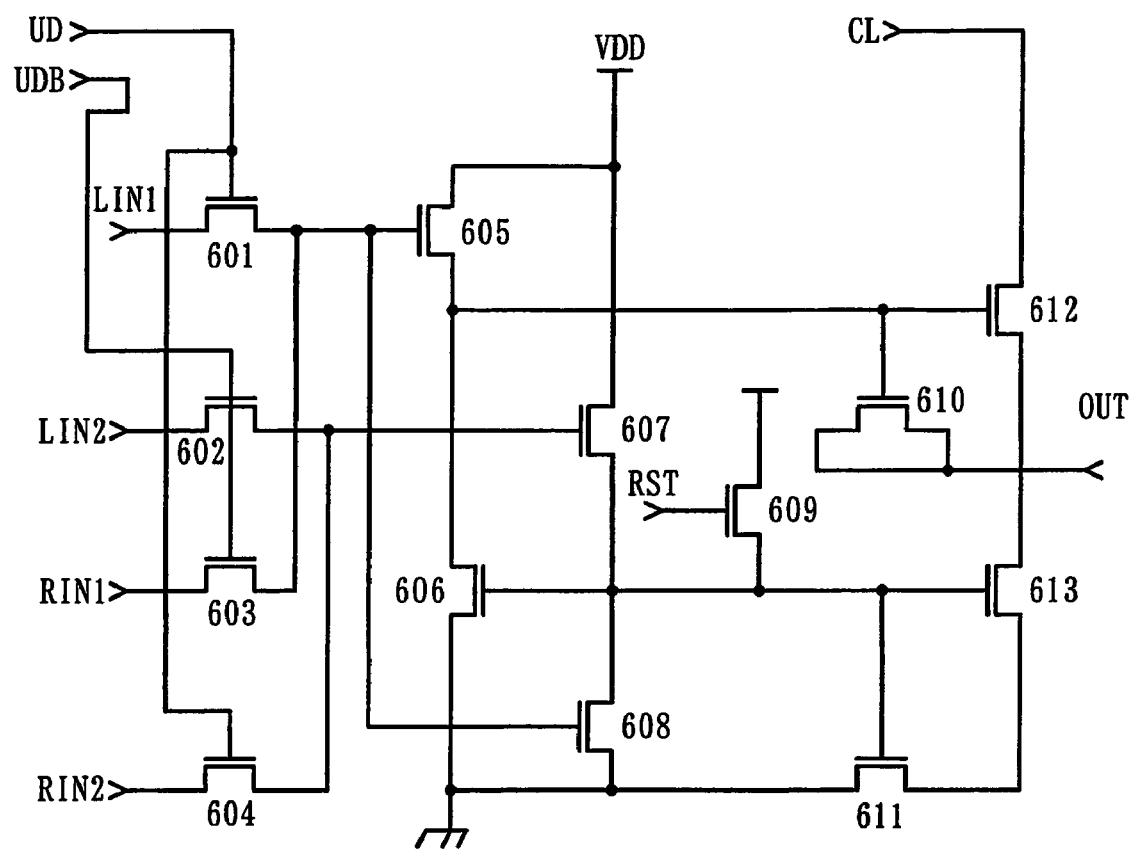
FIG. 23 shows a diagram illustrating a circuit structure in the case of forming a scanning line driver circuit with a TFT in an EL display panel according to a certain aspect of the invention (a shift register circuit)

FIG. 23 shows a specific structure of the pulse output circuit 500, and this pulse output circuit 500 is composed of n-channel type TFTs 601 to 613. The size of the TFTs may be decided by the pulse output circuit 500 in consideration of an operating characteristic of the n-channel type TFTs using an SAS. For example, when a channel length is set to be 8 µm, the channel width can be set ranging from 10 µm to 80 µm.

Figure 24:
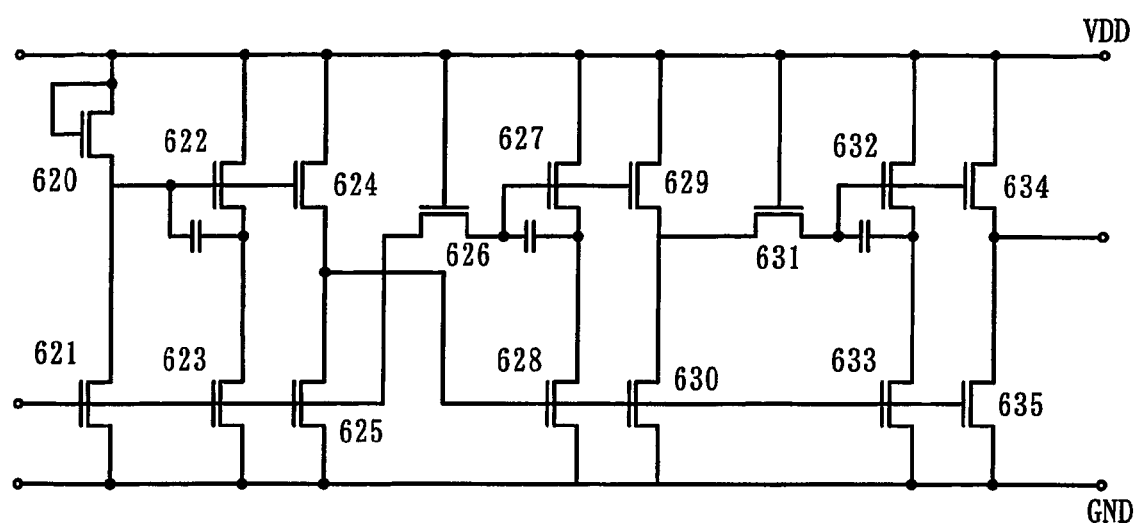
FIG. 24 shows a diagram illustrating a circuit structure in the case of forming a scanning line driver circuit with a TFT in an EL display panel according to a certain aspect of the invention (a buffer circuit)

In addition, FIG. 24 shows a specific structure of the buffer circuit 501. The buffer circuit is composed of n-channel type TFTs 620 to 635 in the same manner. At this time, the size of the TFTs may be decided in consideration of an operating characteristic of the n-channel type TFTs using an SAS. For example, when a channel length is set to be 10 µm, the channel width can be set ranging from 10 µm to 1800 µm.

Figure 14:
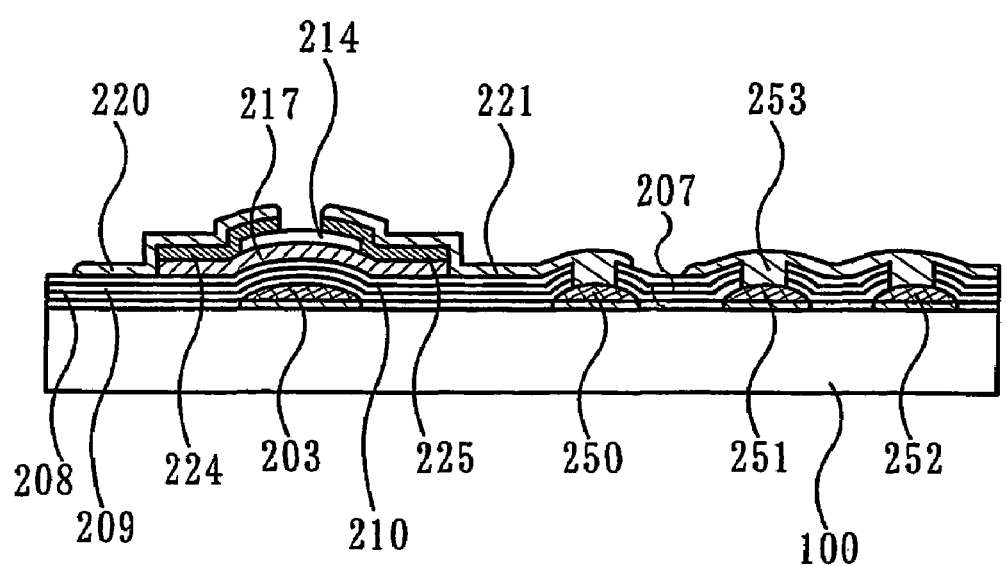
FIG. 14 shows a cross-sectional view illustrating a step of manufacturing an EL display panel according to a certain aspect of the invention.

It is necessary to connect the TFTs with each other by wirings to realize such a circuit, and FIG. 14 shows a structure example of wirings in the case thereof. As well as in Embodiment Mode 1, FIG. 14 shows a state in which a gate electrode 203, a gate insulating layer 207 (a lamination body of three layer including a first insulating layer 208 containing silicon nitride, a second insulating layer 209 containing silicon oxide, and a third insulating layer 210 containing silicon nitride), a semiconductor layer 217 formed from an SAS, an insulating layer 214 which forms a channel protective layer, n-type semiconductor layers 224 and 225 which forms a source and a drain, and wirings 220 and 221 are formed. In this case, connection wirings 250, 251, and 252 are formed over the substrate 100 in the same step as in that of the gate electrode 203. An etching process is partly carried out on the gate insulating layer so that the connection wirings 250, 251, and 252 are exposed. Accordingly, various kinds of circuits can be realized by connecting the TFTs appropriately by the wirings 220 and 221 and a connection wiring 253 formed in the same step.

Embodiment Mode 4

Figure 26:
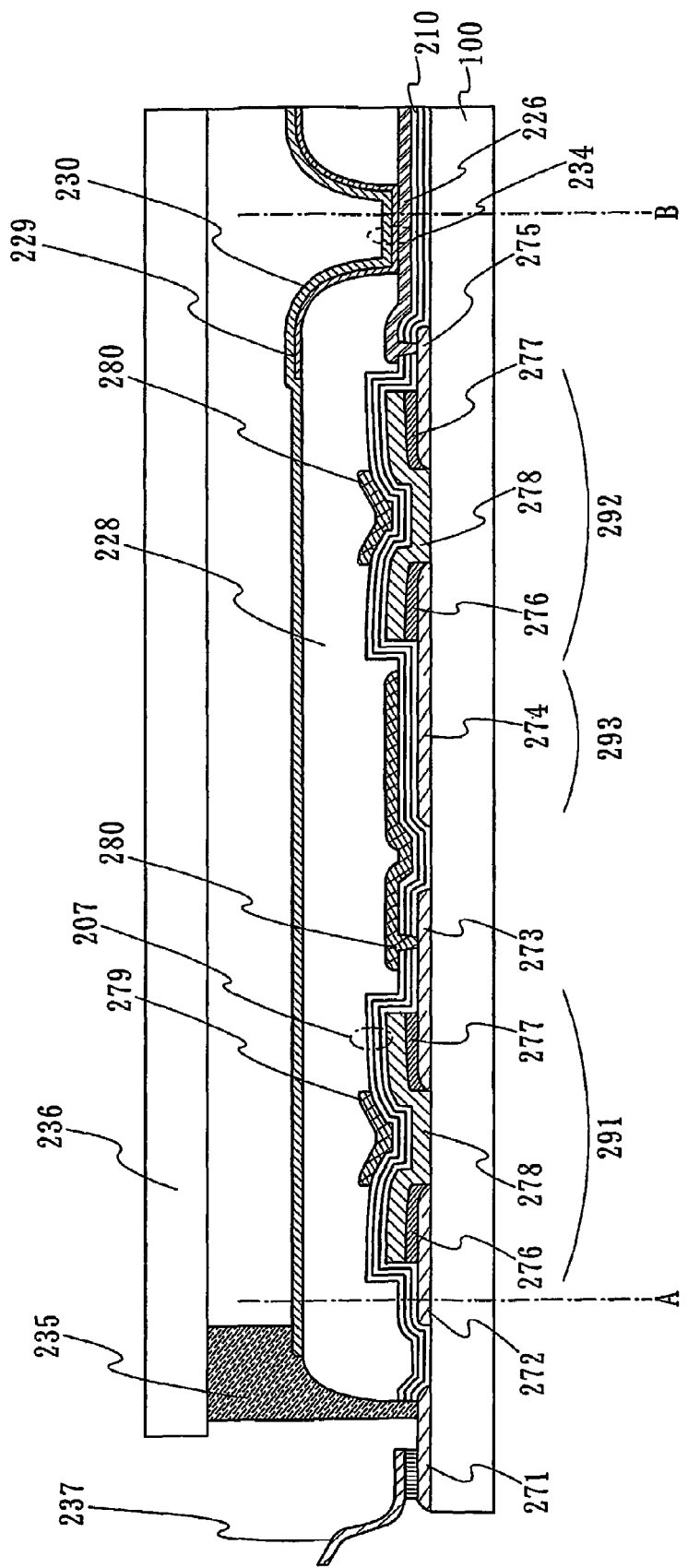
FIG. 26 shows a cross-sectional view illustrating an EL display panel according to a certain aspect of the invention.
Figure 31:
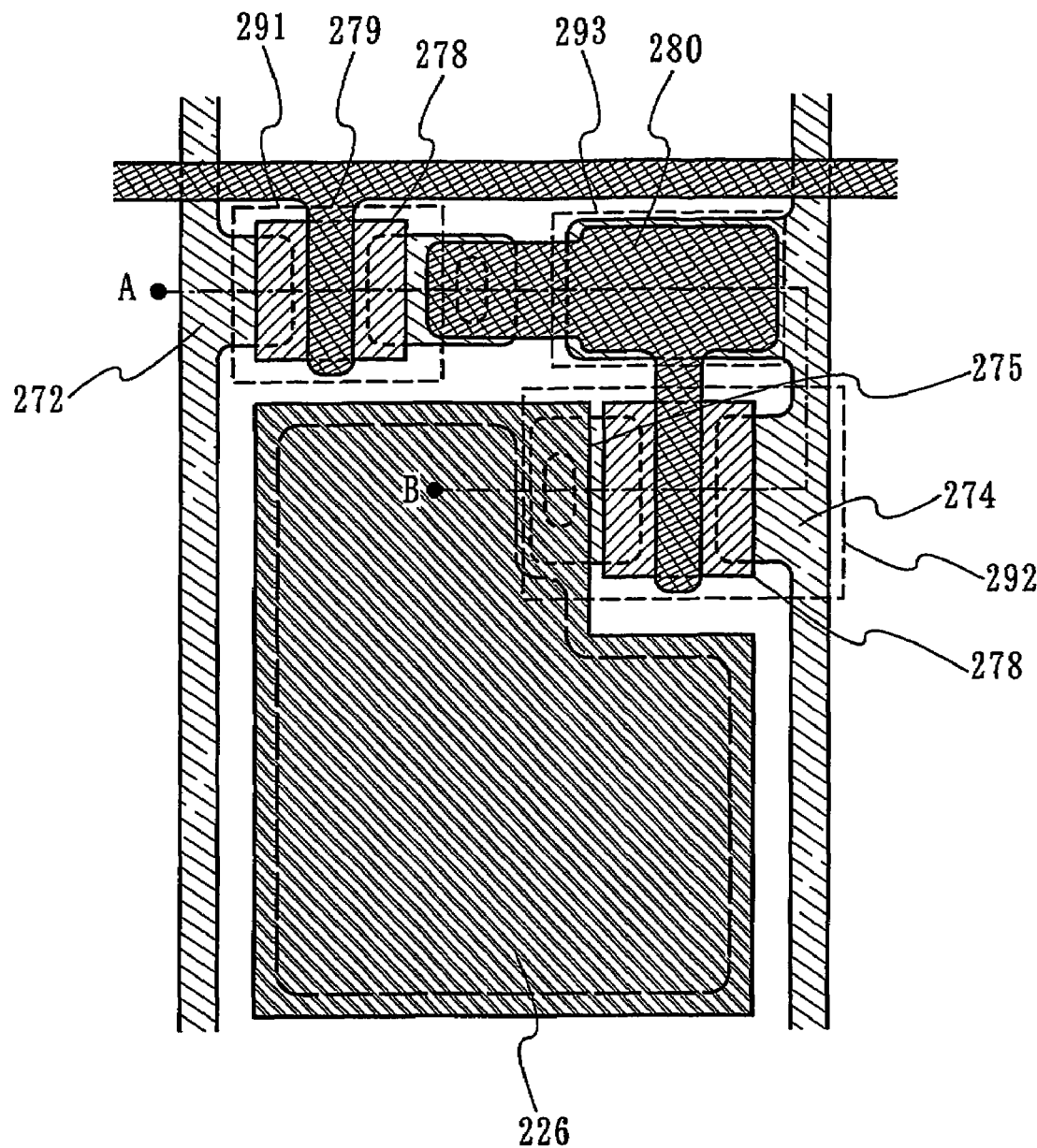
FIG. 31 shows a top view illustrating an EL display panel according to a certain aspect of the invention.

A top gate type TFT manufactured by a droplet discharge method is explained in Embodiment Mode 4 with reference to FIG. 26 and FIG. 31.

Wirings 271, 272, 273, 274, and 275 are formed over a substrate 100 by a droplet discharge method. A composition containing particles of a metal such as Ag (silver), Au (gold), Cu (copper), W (tungsten), or Al (aluminum) as the main component can be used for the conductive material which forms these layers. Specifically, the wirings connected to a source and a drain are preferable to be low resistance. Therefore, a material in which any one of gold, silver, or copper dissolved or dispersed in a solvent is preferably used, and more preferably silver or copper with low resistance is used in consideration of a specific resistance value. A solvent corresponds to an organic solvent such as esters such as butyl acetate, alcohols such as isopropyl alcohol, acetone, or the like. Surface tension and viscosity is appropriately adjusted by adjusting density of a solution and adding a surface activator or the like. As well as in Embodiment Mode 1, a base layer may be provided.

After forming an n-type semiconductor layer on the entire surface of the wirings 272, 273, 274, and 275 connected to the source and the drain, the n-type semiconductor layer between the wirings 272 and 273, the wirings 274 and 275 are removed by etching. Then, an AS or an SAS is formed with a vapor phase growth method or a sputtering method. When a plasma CVD method is used, an AS is formed by using SiH$_4$ which is a semiconductor material gas or a mixed gas of SiH$_4$ and H$_2$. An SAS is formed from the mixed gas by diluting SiH$_4$ with H$_2$ by from 3 times to 1000 times. Thereafter, the AS or the SAS and the n-type semiconductor layer are etched. Accordingly, a semiconductor layer 278 and n-type semiconductor layers 276 and 277 are formed. When an SAS is formed, the crystallinity is more satisfactory on a side of the surface of the semiconductor layer 278, and a combination with a top gate type TFT in which gate electrodes 279 and 280 are formed over the semiconductor layer 278 is suitable.

The semiconductor 278 is formed in a position corresponding to the wirings 272, 273, 274, and 275 by using a mask formed by a droplet discharge method. In other words, the semiconductor layer 278 is formed to overlap with the wirings 272 and 273 (or the wirings 274 and 275). At this time, the n-type semiconductor layers 276 and 277 are sandwiched between the semiconductor layer 278 and the wirings 272, 273, 274, and 275.

Then, a gate insulating layer 207 is formed to have a single layer structure or a laminated structure by using a plasma CVD method or a sputtering method. In the same manner as Embodiment Mode 1, the gate insulating layer 207 may be formed by using silicon nitride and silicon oxide. Furthermore, a semiconductor layer 211 functioning as an active layer is formed. The above-mentioned steps are the same as that in Embodiment Mode 1.

After forming a through hole in the gate insulating layer 207 and partially exposing the wirings 273 and 275, the gate electrodes 279 and 280 are formed with a droplet discharge method. A composition containing particles of a metal such as Ag (silver), Au (gold), Cu (copper), W (tungsten), or Al (aluminum) as the main component can be used for a conductive material which forms this layer.

A first electrode 226 is formed by selectively discharging a composition containing a conductive material to be electrically connected to the wiring 275. The first electrode 226 can serve as a pixel electrode of a display device. Through the above-mentioned steps, a TFT substrate over which a switching TFT 291, a driving TFT 292, and a capacitor portion 293 are formed can be obtained.

This first electrode 226 can be formed by using a droplet discharge method in the case of manufacturing a transmission type EL display device, the first electrode 226 may form a predetermined pattern from a composition containing indium tin oxide (ITO), indium tin oxide containing silicon oxide (ITSO), zinc oxide, tin oxide, or the like and may form a pixel electrode by baking.

It is preferably formed from indium tin oxide (ITO), indium tin oxide containing silicon oxide (ITSO), zinc oxide, or the like by a sputtering method. More preferably, indium tin oxide containing silicon oxide is used with a sputtering method by using a target in which 2 wt. % to 10 wt. % of silicon oxide is contained in ITO.

As a preferable structure of this embodiment mode, the first electrode 226 formed from indium tin oxide containing silicon oxide is formed closely in contact with a third insulating layer 210 made from silicon nitride contained in the gate insulating layer 207. Accordingly, an effect of increasing a ratio of light generated in an EL layer to be radiated outside can be realized.

Furthermore, an insulating layer 228 is formed over the entire surface. After forming the insulating layer over the entire surface by a spin coating method or a dip method, an opening is formed in the insulating layer 228 by an etching process as shown in FIG. 26. The first electrode 226 and the wiring 271 are processed to be exposed by this etching by simultaneously etching the protective layer 227 in the lower layer of the insulating layer 228 and the gate insulating layer 207. In addition, when the insulating layer 228 is formed by a droplet discharge method, an etching process is not necessarily needed.

The insulating layer 228 is formed by providing an opening having a through hole in accordance with a position where a pixel is formed by corresponding to the first electrode 226. This insulating layer 228 can be formed from an inorganic insulating material such as silicon oxide, silicon nitride, silicon oxynitride, aluminum oxide, aluminum nitride, aluminum oxynitride, or the like; acrylic acid, methacrylic acid, and a derivative thereof; a high molecular weight material having heat resistance such as polyimide, aromatic polyamide, or polybenzimidazole; inorganic siloxane including a Si—O—Si bond, among the compound made from silicon, oxygen, and hydrogen, formed by using a siloxane-based material as a start material; or an organic siloxane insulating material in which hydrogen over silicon is substituted by an organic group such as methyl or phenyl. When the insulating layer 228 is formed from a photosensitive material or a non-photosensitive material such as acrylic or polyimide, it is preferable since the edge thereof has a shape in which a curvature radius changes continuously and a thin film in the upper layer is formed without a step disconnection.

Through the above-mentioned steps, a TFT substrate for an EL display panel in which a top gate type (also referred to as a forward stagger type) TFT and the first electrode are connected over the substrate 100 is completed.

Thereafter, an EL layer 229 is formed and a sealing substrate 236 is combined. Before forming the EL layer 229, heat treatment at 200° C. under the atmospheric pressure is carried out to remove the moisture adsorbed in the insulating layer 228 or on the surface thereof. In addition, heat treatment is carried out at temperatures from 200° C. to 400° C., preferably from 250° C. to 350° C. under the low pressure. It is preferable to form the EL layer 229 with a vacuum vapor deposition method or a droplet discharge method under the low pressure without exposing to the atmosphere.

Furthermore, a second electrode 230 is formed on the EL layer to form a light-emitting element 234. This light-emitting element 234 has a structure in which it is connected to the driving TFT 292.

Subsequently, a sealant 235 is formed and the sealing substrate 236 is fixed. Thereafter, a flexible wiring board 237 may be connected to the wiring 271.

As mentioned above, a light-exposure step using a photomask is not used in this embodiment mode; therefore, the step can be skipped. In addition, a display device can be easily manufactured even by using a glass substrate after five generations, one side of which exceeds 1000 mm by forming each kind of pattern directly on a substrate by using a droplet discharge method.

Embodiment Mode 5

A mode of a light-emitting element applicable to Embodiment Mode 1 to Embodiment Mode 4 is explained with reference to FIGS. 17A and 17B and FIGS. 18A and 18B.

Figure 17A:
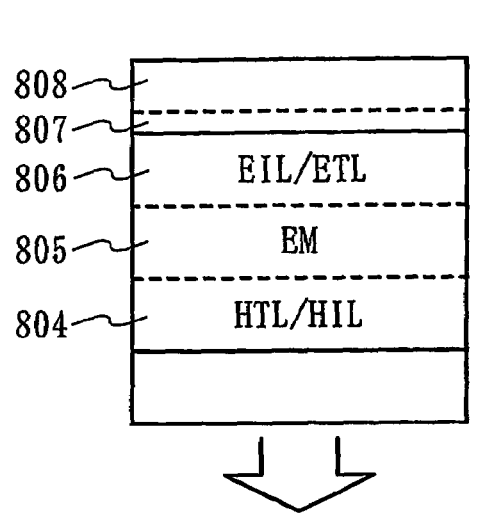
FIGS. 17A and 17B each show diagrams illustrating modes of an applicable light-emitting element according to certain aspects of the invention.

FIG. 17A is an example in which a first electrode 801 is formed from a light-transmitting oxide conductive substance. The light-transmitting conductive oxide substance is preferable to be indium tin oxide containing 1 atomic % to 15 atomic % of silicon oxide in concentration. An EL layer 802 in which a hole injection layer or hole transport layer 804, a light-emitting layer 805, and an electron transport layer or electron injection layer 806 are laminated thereover is provided. A second electrode 803 is formed of a first electrode layer 807 containing an alkaline metal or an alkaline earth metal, for example, LiF or MgAg and a second electrode layer 808 formed from a metal material such as aluminum. The pixel having such a structure can radiate light from the first electrode 801 side as shown in figure with an arrow.

Figure 17B:
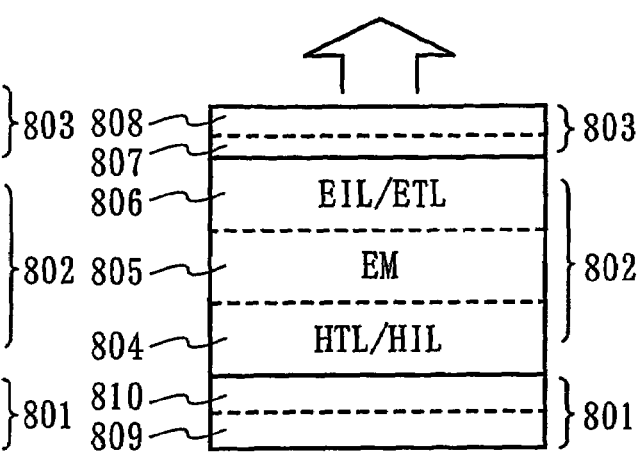

FIG. 17B shows an example of radiating light from a second electrode 803. A first electrode 801 is formed of a first electrode layer 809 formed from a metal such as aluminum or titanium or a conductive material containing the metal and nitrogen of which concentration is in a stoichiometric composition ratio or less and a second electrode layer 810 formed from a conductive oxide material containing 1 atomic % to 15 atomic % of silicon oxide in concentration. An EL layer 802 in which a hole injection layer or hole transport layer 804, a light-emitting layer 805, and an electron transport layer or electron injection layer 806 are laminated thereover is provided. A second electrode 803 is formed of a first electrode layer 807 containing an alkaline metal or an alkaline earth metal, for example, LiF or CaF and a second electrode layer 808 formed from a metal material such as aluminum. However, any one of layers is kept in a state in which light can be transmitted by making the thickness 100 nm or less. Accordingly, it is possible to radiate light from the second electrode 803.

Figure 18A:
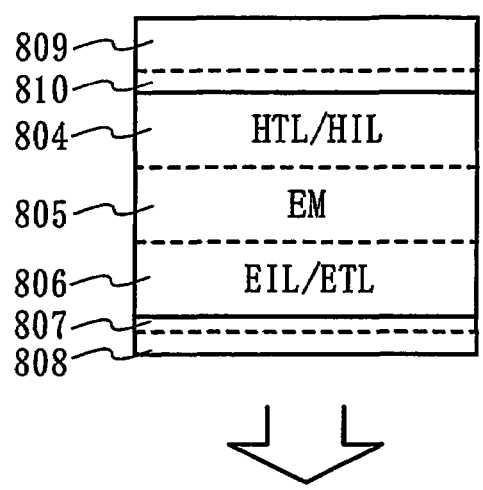
FIGS. 18A and 18B each show diagrams illustrating modes of an applicable light-emitting element according to certain aspects of the invention.

FIG. 18A shows an example of radiating light from a first electrode 801 and shows a structure in which an electron transport layer or electron injection layer 806, a light-emitting layer 805, and a hole injection layer or hole transport layer 804 are sequentially laminated in an EL layer. From an EL layer 802 side, a second electrode 803 is formed of a second electrode layer 810 formed from a conductive oxide material containing 1 atomic % to 15 atomic % of silicon oxide in concentration and a first electrode layer 809 formed from a metal such as aluminum or titanium or a metal containing nitrogen of which concentration is in a stoichiometric composition ratio or less. The first electrode 801 is formed from a first electrode layer 807 containing an alkaline metal or an alkaline earth metal, for example, LiF or CaF and a second electrode layer 808 formed from a metal material such as aluminum. However, any one of layers is kept in a state in which light can be transmitted by making the thickness 100 nm or less. Accordingly, it is possible to radiate light from the first electrode 801.

Figure 18B:
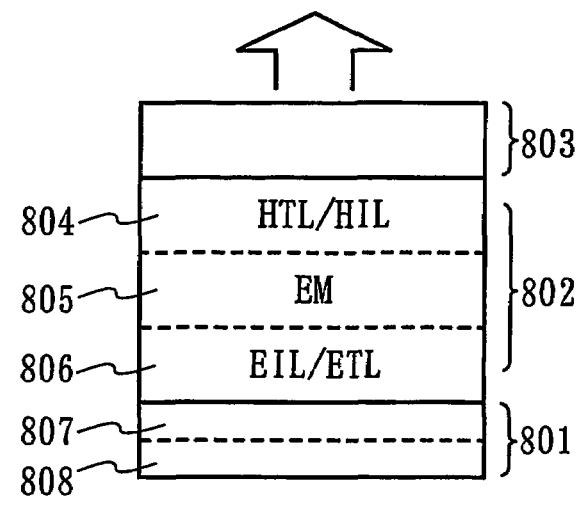

FIG. 18B shows an example of radiating light from a second electrode 803 and shows a structure in which an electron transport layer or electron injection layer 806, a light-emitting layer 805, and a hole injection layer or hole transport layer 804 are sequentially laminated in an EL layer. A first electrode 801 has the same structure as FIG. 18A and is formed thick so as to have a film thickness enough to reflect light emitted in the EL layer. The second electrode 803 is composed of a conductive oxide material containing 1 atomic % to 15 atomic % of silicon oxide in concentration. In this structure, the hole injection layer or hole transport layer 804 is formed from metallic oxide which is an inorganic substance (typically, molybdenum oxide or vanadium oxide). Accordingly, oxygen introduced at the time of forming the second electrode 803 is supplied and hole injection properties are improved; therefore, a drive voltage can be decreased.

Embodiment Mode 6

Next, a mode of mounting a driver circuit for driving on an EL display panel manufactured by Embodiment Mode 1, Embodiment Mode 2, and Embodiment Mode 3 is explained with reference to FIGS. 19A and 19B and FIGS. 20A and 20B.

Figure 19A:
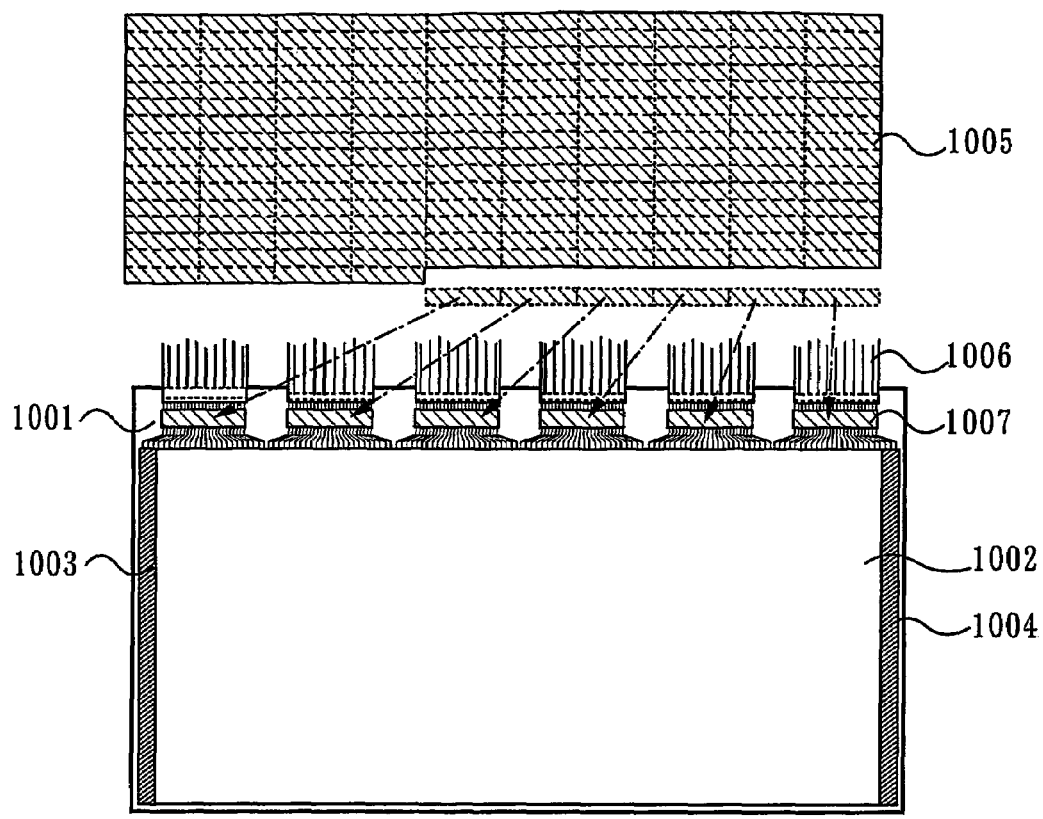
FIGS. 19A and 19B each show a mounting method of a driver circuit of an EL display panel according to certain aspects of the invention.
Figure 19B:
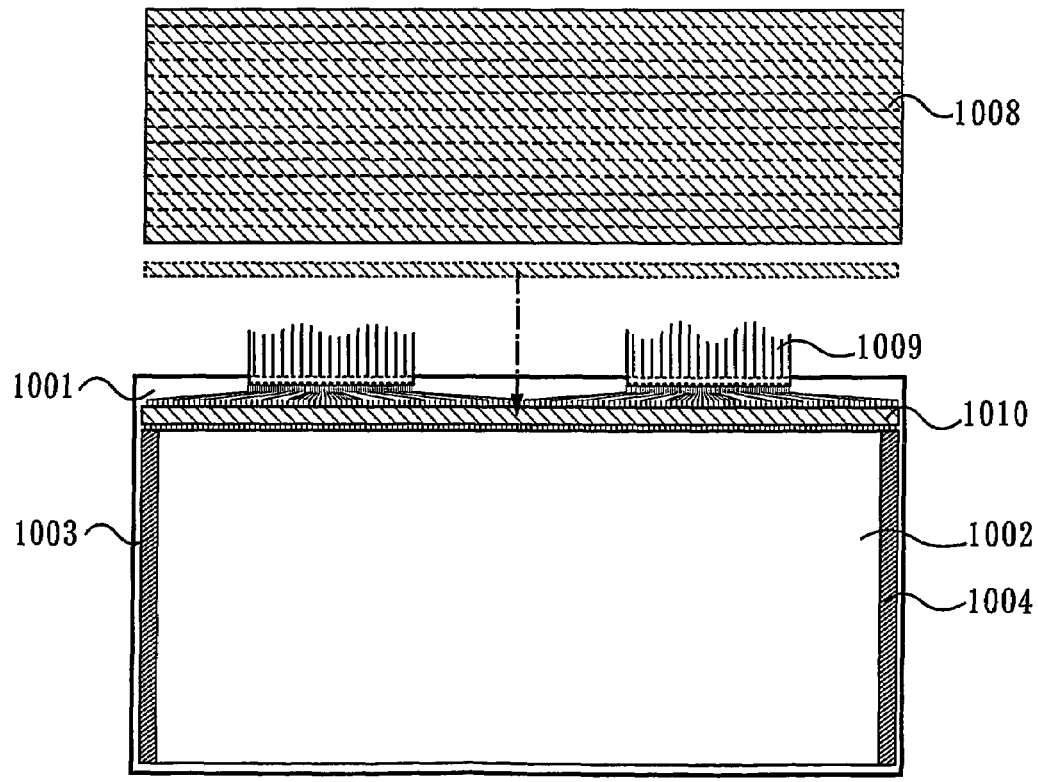

First, a display device to which a COG method is applied is explained with reference to FIGS. 19A and 19B. FIGS. 19A and 19B each show a display device in which a pixel portion 1002 displaying information such as a character or an image and scanning line driver circuits 1003 and 1004 are provided on a substrate 1001.

In FIG. 19A, individual driver circuit (hereinafter referred to as a driver IC) is taken out and mounted by separating a large-sized substrate 1005 on which a plurality of driver circuits is formed. The large-sized substrate 1005 may be the same as a glass substrate used for a display device. Driver ICs 1007 can be obtained by forming a plurality of driver ICs on a rectangular substrate of which one side is, for example, from 300 mm to 1000 mm or more and by separating it. The driver ICs 1007 are separated by forming it in a rectangular shape of which major axis is from 15 mm to 80 mm and minor axis is from 1 mm to 6 mm in consideration of a length of one side of the pixel portion or a pixel pitch. Apart cost can be reduced by forming the driver ICs on the large-sized substrate 1005 with a TFT using a crystalline semiconductor film.

FIG. 19A shows a mode in which a plurality of the driver ICs 1007 is mounted on the substrate 1001 and has a structure in which a signal is inputted from an external circuit by connecting a flexible wiring 1006 at the end of the driver ICs 1007. FIG. 19B shows a structure in which a long driver IC 1010 cut from a large-sized substrate 1008 is mounted on the substrate 1001. A mode in which a flexible wiring 1009 is mounted on at the end of the long driver IC 1010 is shown. The number of parts can be reduced and the number of steps can be reduced by using such a long driver IC.

Figure 20A:
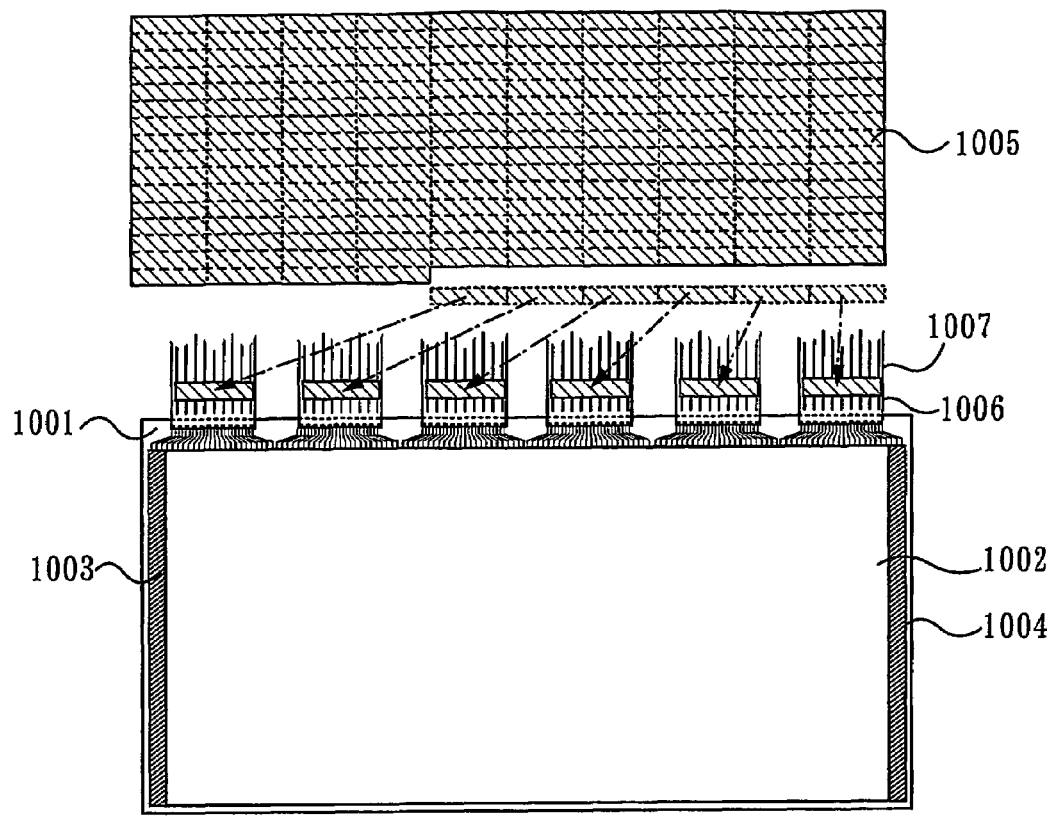
FIGS. 20A and 20B each show a mounting method of a driver circuit of an EL display panel according to certain aspects of the invention.
Figure 20B:
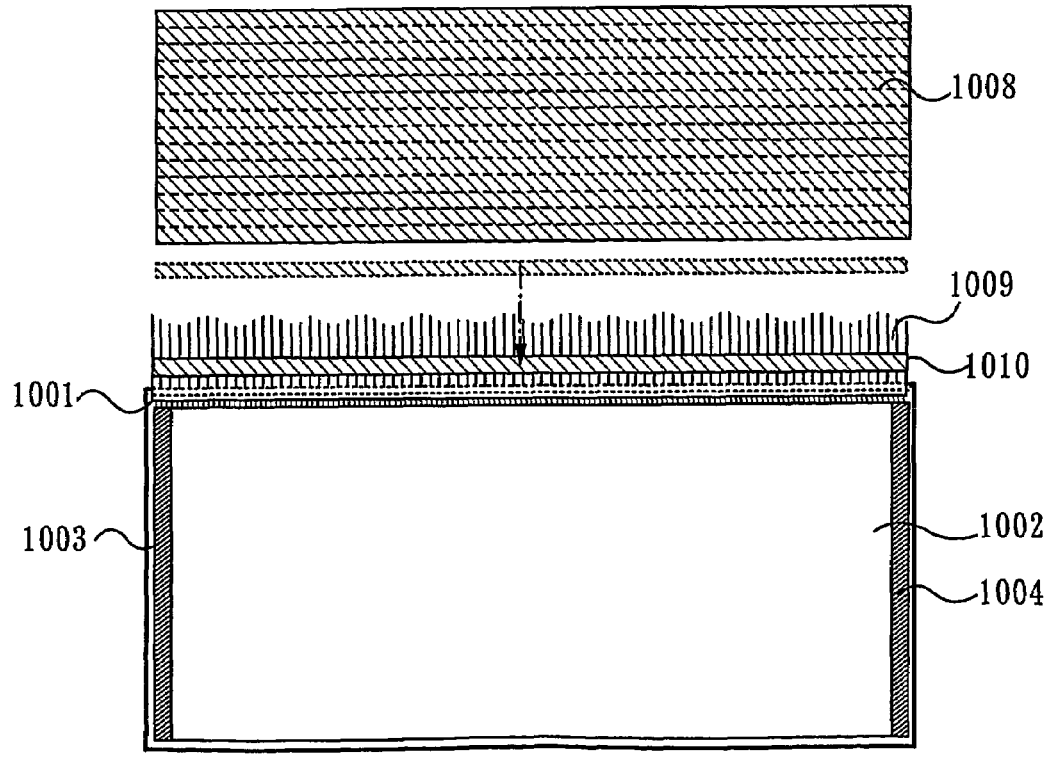

Next, a display device to which a TAB method is adopted is explained with reference to FIGS. 20A and 20B. A pixel portion 1002 and scanning line driver circuits 1003 and 1004 are provided on a substrate 1001. In FIG. 20A, a plurality of flexible wirings 1006 is attached to the substrate 1001. Driver ICs 1007 are mounted on the flexible wirings 1006. FIG. 20B shows a mode in which a flexible wiring 1009 is attached on the substrate 1001 and a driver IC 1010 is mounted on the flexible wiring 1009. In the case of applying the latter, metal pieces or the like that fixes the driver IC 1010 may be attached together in respect of intensity. The number of parts can be reduced and the number of steps can be reduced by using such a long driver IC.

The restriction specifically on a length of a major axis is relieved by forming the driver IC on the glass substrate as in FIGS. 19A and 19B and FIGS. 20A and 20B, and less number necessary for mounting corresponding to the pixel portion 1002 is achieved. In other words, a long driver IC cannot be formed of a driver IC formed from single crystal silicon due to mechanical strength or restriction of a substrate. When a driver IC is formed on a glass substrate, the driver IC does not lose productivity since it is not limited to a shape of a substrate used as a mother body. This is a large predominant respect as compared with the case of taking out IC chips from a circular silicon wafer.

The driver IC 1007 shown in FIGS. 19A and 19B and FIGS. 20A and 20B are signal line driver circuits. In order to form a pixel portion corresponding to a RGB full color, 3072 signal lines in a XGA class and 4800 signal lines in a UXGA class are necessary. The signal line formed in such a number forms a leading out line by dividing into several blocks on an edge of the pixel portion 1002 and is gathered in accordance with a pitch of an output terminal of the driver IC 1007.

The driver ICs are preferably formed from a crystalline semiconductor formed over a substrate. The crystalline semiconductor is preferable to be formed by being irradiated with a continuous-wave laser. Therefore, a continuous-wave solid state laser or gas laser is used as an oscillator in which the laser light is generated. There is few crystal defects when a continuous-wave laser is used, and as a result, a transistor can be manufactured by using a polycrystalline semiconductor layer with a large grain size. In addition, high-speed driving is possible since mobility or a response speed is favorable, and it is possible to further improve an operating frequency of an element than that of the conventional element; therefore, high reliability can be obtained since there is few properties variations. Note that a channel-length direction of a transistor and a scanning direction of laser light may be accorded with each other to further improve an operating frequency. This is because the highest mobility can be obtained when a channel length direction of a transistor and a scanning direction of laser light with respect to a substrate are almost parallel (preferably, from −30° to 30°) in a step of laser crystallization by a continuous-wave laser. A channel length direction coincides with a direction of current floating in a channel formation region, in other words, a direction in which an electric charge moves. The transistor thus manufactured has an active layer composed of a polycrystalline semiconductor layer in which a crystal grain is extended in a channel direction, and this means that a crystal grain boundary is formed almost along a channel direction.

In carrying out laser crystallization, it is preferable to narrow down the laser light largely, and a beam spot thereof preferably has a width of approximately from 1 mm to 3 mm of which width is the same as that of a minor axis of the driver ICs. In addition, in order to ensure an object to be irradiated an enough and effective energy density, an irradiated region of the laser light is preferably a linear shape. However, a linear shape here does not refer to a line in a proper sense, but refers to a rectangle or an oblong with a large aspect ratio. For example, the linear shape refers to a rectangle or an oblong with an aspect ratio of 2 or more (preferably from 10 to 10000). Accordingly, productivity can be improved by identifying a width of a beam spot of the laser light with that of a minor axis of the driver ICs.

In FIGS. 19A and 19B and FIGS. 20A and 20B, a mode in which the scanning line driver circuit is integrally formed with the pixel portion and the driver ICs are mounted as a signal line driver circuit is shown. However, this embodiment mode is not limited to this mode, and the driver ICs may be mounted as both a scanning line driver circuit and a signal line driver circuit. In that case, it is preferable to differentiate a specification of the driver ICs to be used between the scanning line and signal line side. For example, a withstand pressure of around 30 V is required for the transistor composing the scanning line driver ICs; however, a drive frequency is 100 kHz or less and a high speed operation is comparatively not required. Therefore, it is preferable to set a sufficiently long channel-length (L) of the transistor composing the scanning line driver. On the other hand, a withstand pressure of around 12 V is enough for the transistor of the signal line driver ICs; however, a drive frequency is around 65 MHz at 3 V and a high speed operation is required; Therefore, it is preferable to set a channel-length or the like of the transistor composing a driver with a micron rule.

In the pixel portion 1002, the signal line and the scanning line are intersected to form a matrix and a transistor is arranged in accordance with each intersection. A TFT having a structure in which a channel is formed from an amorphous semiconductor or a semi-amorphous semiconductor can be used as the transistor arranged in the pixel portion 1002 in this embodiment mode. An amorphous semiconductor is formed by a method such as a plasma CVD method or a sputtering method. It is possible to form a semi-amorphous semiconductor at a temperature of 300° C. or less with plasma CVD. A film thickness necessary to form a transistor is formed in a short time even in the case of a non-alkaline glass substrate of an external size of, for example, 550 mm×650 mm. The feature of such a manufacturing technique is effective in manufacturing a display device of a large-sized screen. In addition, a semi-amorphous TFT can obtain electron field-effect mobility of 1 $cm^2$/V·sec to 15 $cm^2$/V·sec by composing a channel formation region with an SAS. Therefore, this TFT can be used as a switching element of pixels and as an element which composes the scanning line driver circuit.

As mentioned above, the driver circuit can be incorporated into an EL display panel. According to this embodiment mode, a display device can be easily manufactured even by using a glass substrate after five generations, one side of which exceeds 1000 mm.

Embodiment Mode 7

A structure of a pixel applicable to display devices shown in Embodiment Mode 1 to Embodiment Mode 6 is explained with reference to equivalent circuit diagrams shown in FIGS. 21A to 21F.

Figure 21A:
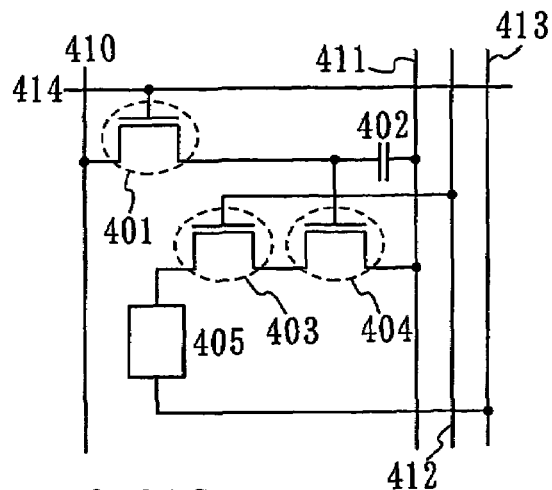
FIGS. 21A to 21F each show circuit diagrams illustrating a structure of a pixel applicable to an EL display panel according to certain aspects of the invention.

In a pixel shown in FIG. 21A, a signal line 410 and power supply lines 411 to 413 are arranged in a column direction and a scanning line 414 is arranged in a row direction. In addition, a switching TFT 401, a driving TFT 403, a current control TFT 404, a capacitor element 402, and a light-emitting element 405 are included.

Figure 21B:
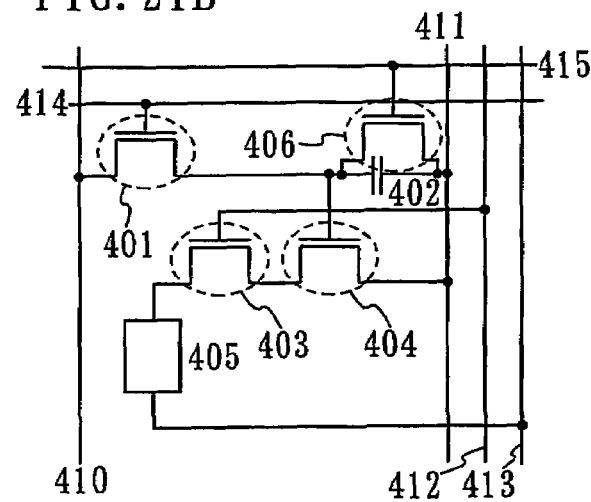
Figure 21C:
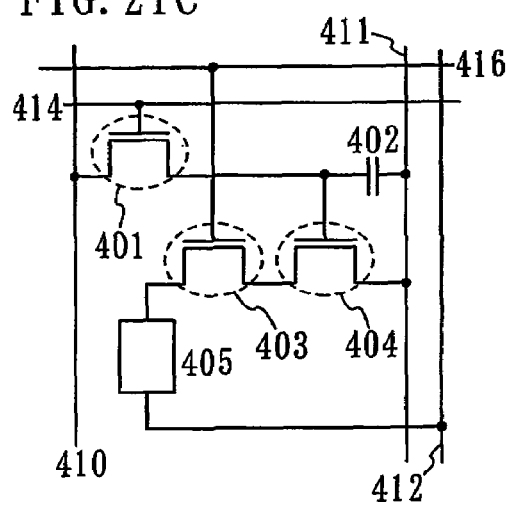

A pixel shown in FIG. 21C has the same structure as the pixel shown in FIG. 21A except that a gate electrode of the driving TFT 403 is connected to a power supply line 416 arranged in a row direction. The difference between the pixels shown in FIG. 21A and FIG. 21C is that the power supply lines are formed from different conductive layer when the power supply line 412 is arranged in a row direction (FIG. 21A) and when the power supply line 412 is arranged in a column direction (FIG. 21C). Here, a wiring connected to the gate electrode of the driving TFT 403 is focused and the figures are separately shown in FIGS. 21A and 21C to show that the wiring has different layers to be formed.

In the pixels shown in FIG. 21A and FIG. 21C, the driving TFT 403 and the current control TFT 404 are connected in series. It is preferable to set a channel length L3 and a channel width W3 of the driving TFT 403 and a channel length L4 and a channel width W4 of the current control TFT 404 so as to satisfy L3/W3: L4/W4=5 to 6000:1. As an example of the case satisfying 6000:1, it is when L3 is 500 μm, W3 is 3 μm, L4 is 3 μm, and W4 is 100 μm.

The driving TFT 403 operates in a saturation region and controls a current value flowed through the light-emitting element 405. The current control TFT 404 operates in a linear region and controls supply of current to the light-emitting device 405. It is preferable in terms of manufacturing steps if these TFTs have the same conductive type. In addition, not only an enhancement type but also a depletion type TFT may be used for the driving TFT 403. In the present invention having the above-mentioned embodiment, the current control TFT 404 operates in a linear region; therefore, a slight variation of VGS in the current control TFT 404 does not affect a current value of the light-emitting element 405. In other words, the current value of the light-emitting element 405 depends on the driving TFT 403 operated in a saturation region. In the invention having the above-mentioned embodiment, a display device in which image quality is improved by improving luminance variation resulted from variations in TFT properties can be provided.

FIG. 21A and FIG. 21C each show a structure in which the capacitor element 402 is provided; however, the invention is not limited thereto. When a gate capacitor or the like can be substituted for a capacitor that can hold a video signal, explicitly, the capacitor element 402 may not be provided.

The light-emitting element 405 has a structure in which an electroluminescent layer is sandwiched between two electrodes, and potential difference between a pixel electrode and an opposite electrode (between an anode and a cathode) are provided so that a voltage in a forward bias direction is applied. The electroluminescent layer is composed of widespread material such as an organic material or an inorganic material, and fluorescence when luminescence returns from a singlet excited state to a ground state and phosphorescence when luminescence returns from a triplet excited state to a ground state are included in luminescence of this electroluminescent layer.

Figure 21D:
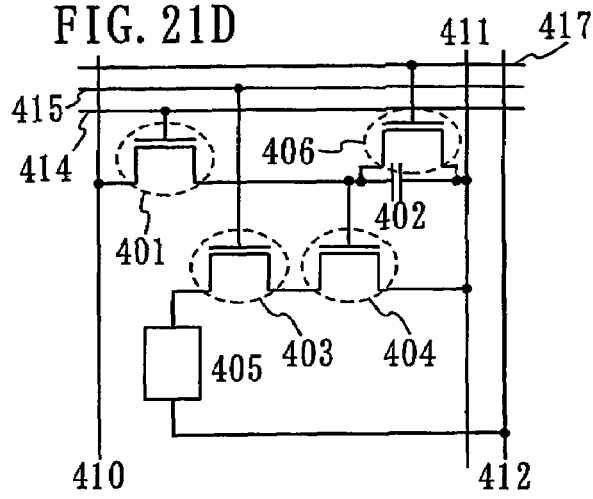

A pixel shown in FIG. 21B has the same structure as the pixel shown in FIG. 21A except that a TFT 406 and a scanning line 415 are added. In the same manner, a pixel shown in FIG. 21D is the same as the pixel structure shown in FIG. 21C except that a TFT 406 and a scanning line 417 are added. In the TFT 406, ON or OFF is controlled by the scanning line 415 that is newly arranged. When the TFT 406 is turned ON, an electric charge held in the capacitor element 402 is discharged, and the TFT 406 is turned OFF. In other words, it is possible to forcefully make a state in which current does not flow through the light-emitting element 405 by disposing the TFT 406.

Therefore, in the structures of FIG. 21B and FIG. 21D, a lighting period can be started simultaneously with or right after a start of a writing period without waiting for writing of a signal in all pixels. Accordingly, it is possible to improve a duty ratio.

In pixels shown in FIGS. 21A to 21D, the TFT 401 controls input of a video signal to a pixel. When the switching TFT 401 is turned ON and the video signal is inputted to a pixel, the video signal is held in the capacitor element 402. A plurality of TFTs connected in series to the light-emitting element 405 is provided like pixels shown in FIGS. 21A to 21D, and one of them is operated in a saturation region; therefore, display that controls variation of luminance in light-emitting element 405 can be carried out.

Figure 21E:
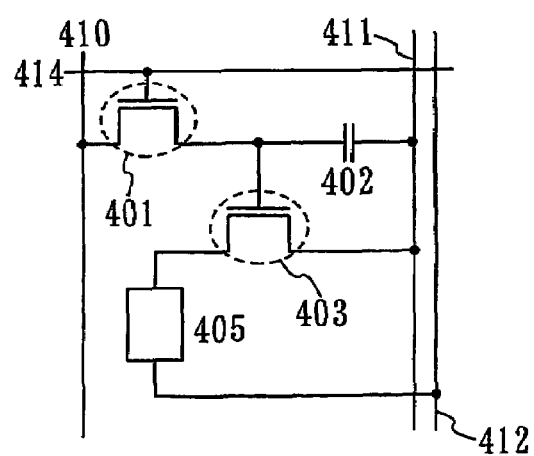
Figure 21F:
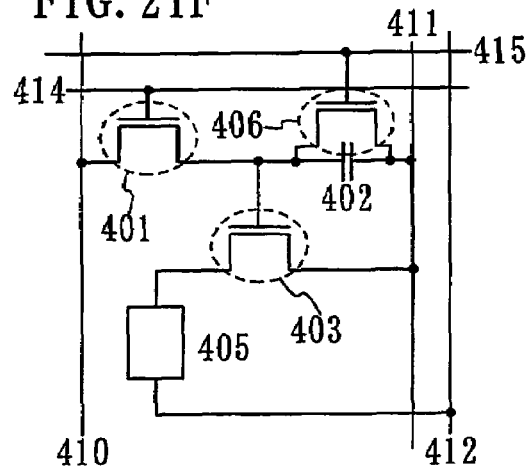

In a pixel shown in FIG. 21E, a signal line 410 and power supply lines 411 and 412 are arranged in a column direction, and a scanning line 414 is arranged in a row direction. In addition, a switching TFT 401, a driving TFT 403, a capacitor element 402, and a light-emitting element 405 are included. A pixel shown in FIG. 21F has the same structure as a pixel shown in FIG. 21E except that a TFT 406 and a scanning line 415 are added. When display is carried out with time gray scale, a rate of a light-emitting period to a non-light emitting period can be increased by disposing the TFT 406 also in a structure of FIG. 21F.

Embodiment Mode 8

Figure 15:
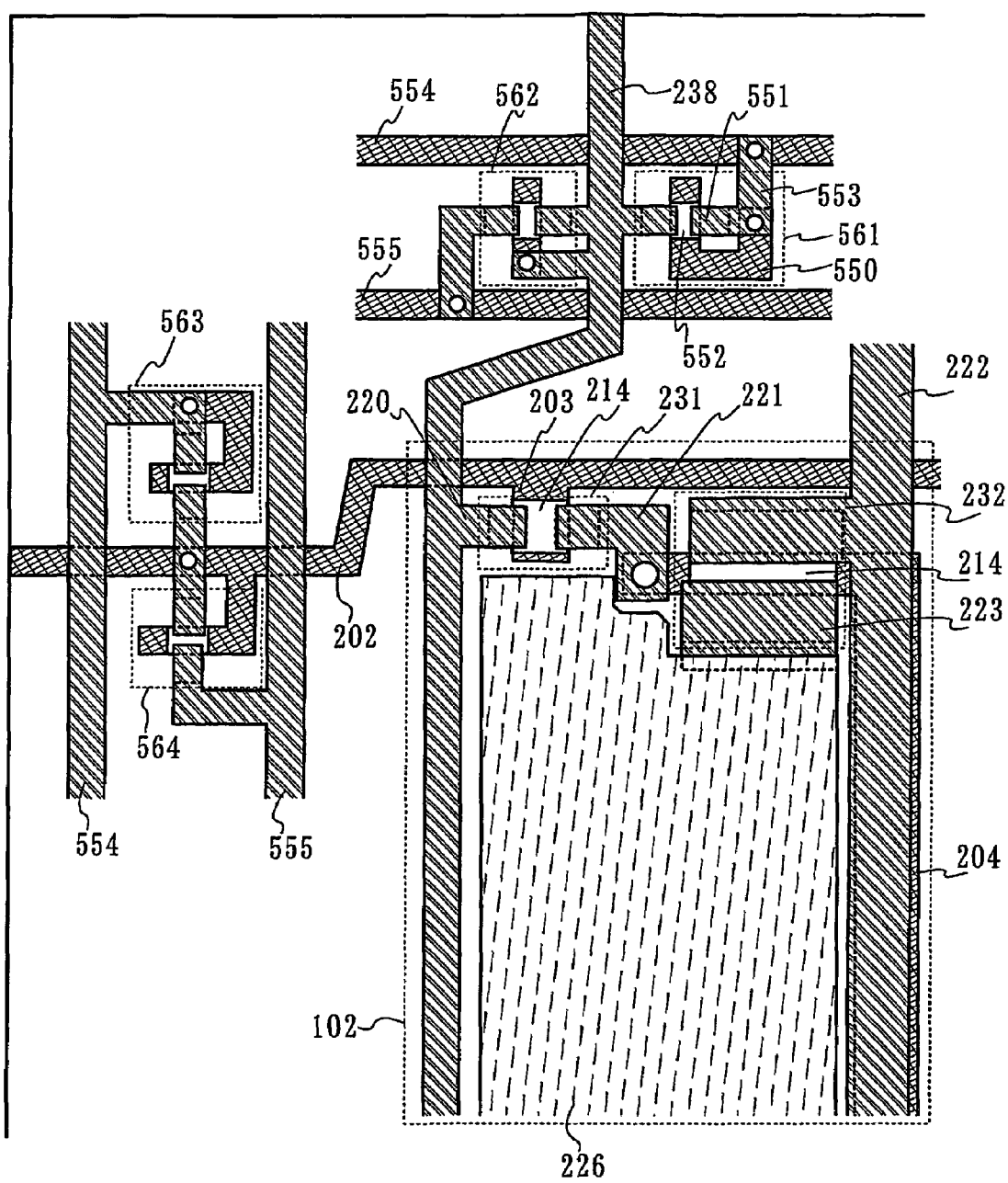
FIG. 15 shows a top view illustrating an EL display panel according to a certain aspect of the invention.

In a display device shown in Embodiment Mode 1 and Embodiment Mode 2, one mode in which a protective diode is provided for a scanning line input terminal portion and a signal line input terminal portion is explained with reference to FIG. 15. A switching TFT 231 and a driving TFT 232 are provided for a pixel 102 in FIG. 15.

Figure 16:
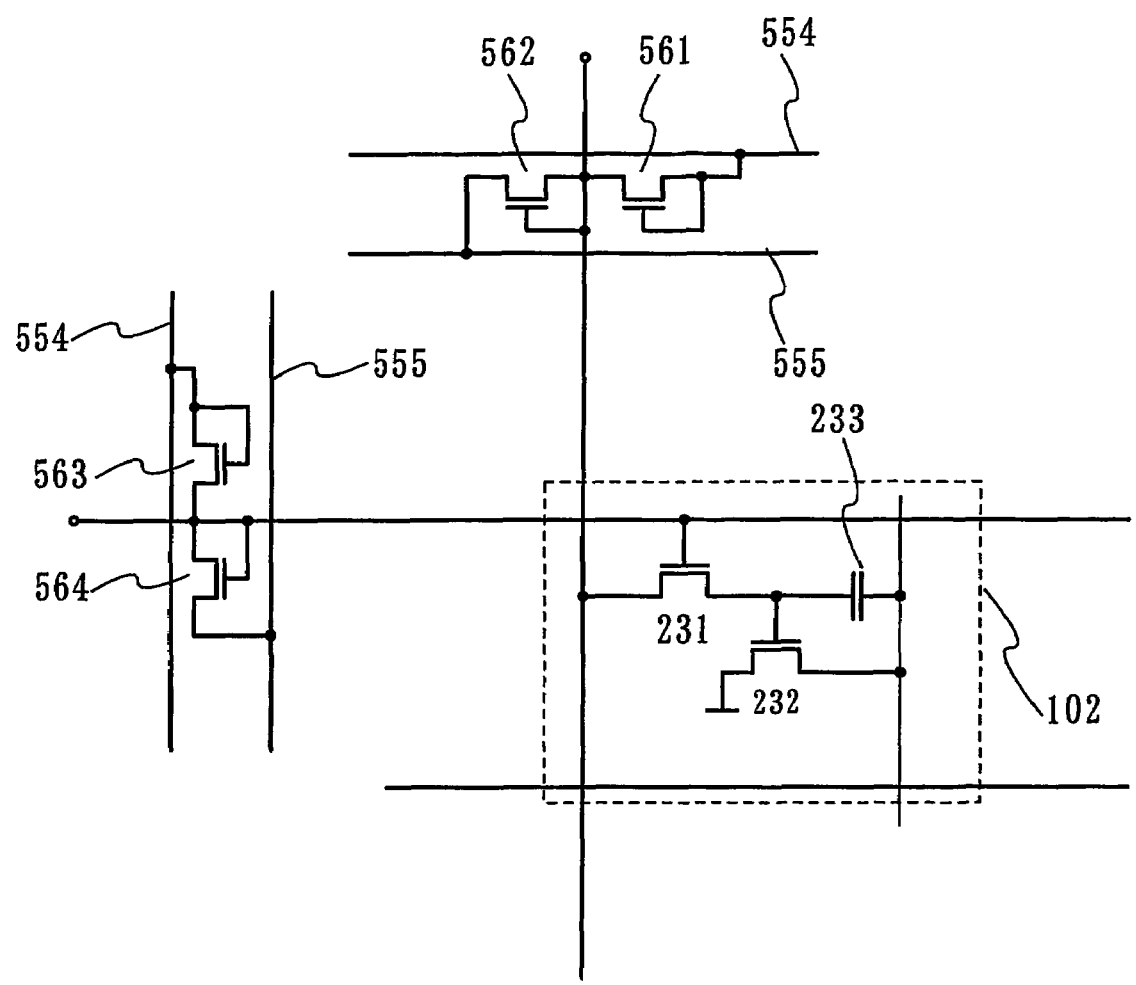
FIG. 16 shows an equivalent circuit diagram of an EL display panel illustrated in FIG. 15.

Protective diodes 561 and 562 are provided for the signal line input terminal portion. These protective diodes are manufactured in the same step as that of the switching TFT 231 and the driving TFT 232. The protective diodes 561 and 562 are operated as a diode by being connected to a gate and one of a drain and a source. FIG. 16 shows an equivalent circuit diagram such as a top view shown in FIG. 15.

The protective diode 561 includes a gate electrode 550, a semiconductor layer 551, an insulating layer for channel protection 552, and a wiring 553. The protective diode 562 has the same structure. Common potential lines 554 and 555 connecting to this protective diode are formed in the same layer as that of the gate electrode. Therefore, it is necessary to form a contact hole in a gate insulating layer to electrically connect to the wiring 553.

A mask may be formed by a droplet discharge method and an etching process may be carried out to form a contact hole in the gate insulating layer. In this case, when an etching process by atmospheric pressure discharge is applied, a local discharge process is also possible, and it does not need to form a mask over an entire surface of a substrate.

A signal wiring 238 is formed in the same layer as that of a wiring 220 in the switching TFT 231 and has a structure in which the signal wiring 238 connected thereto is connected to a source side or a drain side.

Protective diodes 563 and 564 of the input terminal portion of the scanning signal line side also have the same structure. According to the present invention, the protective diodes provided in an input stage can be formed at the same time. Note that the position of depositing a protective diode is not limited to this embodiment mode and can be also provided between a driver circuit and a pixel as shown in FIG. 3.

Embodiment Mode 9

Figure 27:
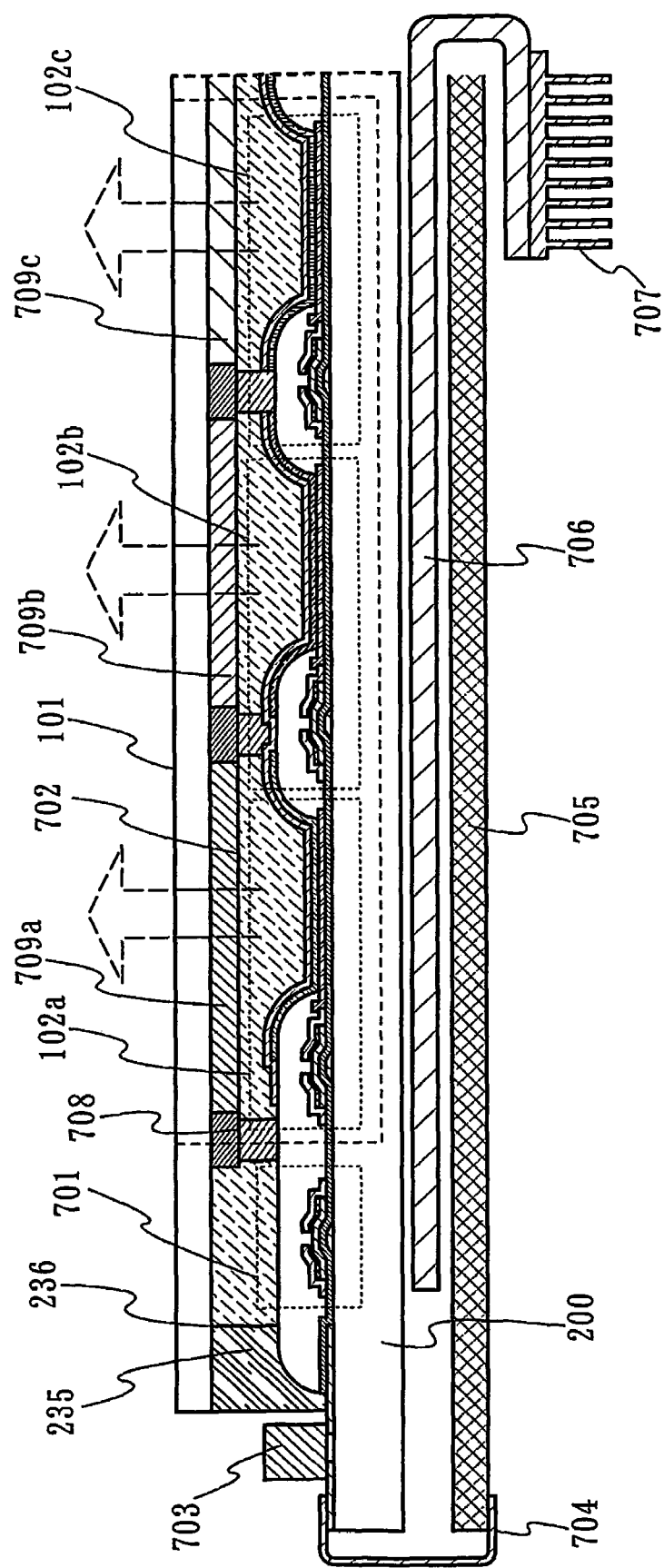
FIG. 27 shows a cross-sectional view illustrating a structure example of an EL display module according to a certain aspect of the invention.
Figure 28:
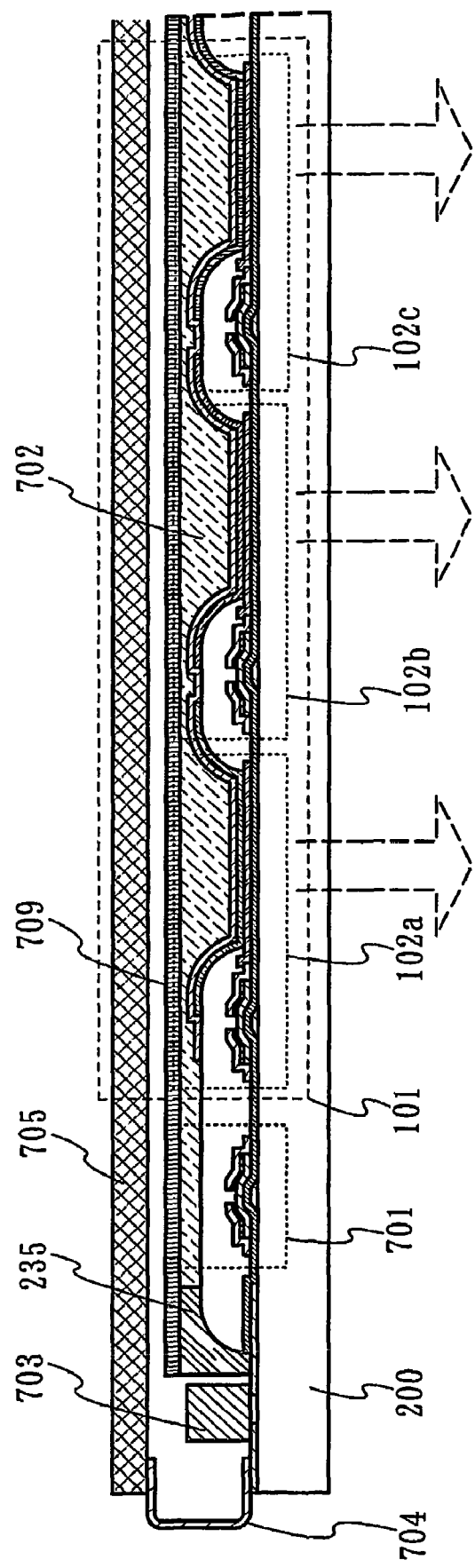
FIG. 28 shows a cross-sectional view describing a structure example of an EL display module according to a certain aspect of the invention.

FIGS. 27 and 28 shows an example of constituting an EL display module by using a TFT substrate 200 manufactured by a droplet discharge method. In FIGS. 27 and 28, the TFT substrate 200 is provided with a pixel portion 101 including a pixel 102.

In FIG. 27, the same TFT as that formed in a pixel or a protective circuit portion 701 operating in the same manner as a diode by being connected to a gate and one of a source or a drain of the TFT is provided between a driver circuit 703 and the pixel 102 and outside the pixel portion 101. A driver IC formed from a single crystal semiconductor, a stick driver IC formed from a polycrystalline semiconductor film over a glass substrate, a driver circuit formed from an SAS, or the like is applied to the driver circuit 703.

The TFT substrate 200 is fixed to a sealing substrate 236 by sandwiching a spacer 708 formed with a droplet discharge method therebetween. Even when the substrate has thin thickness or an area of the pixel portion is enlarged, the spacer is preferable to be provided to hold constant a space between the two substrates. A light-transmitting resin material may be filled to solidify or anhydrous nitrogen or an inert gas may be filled in a gap between the TFT substrate 200 and the sealing substrate 236 over a light-emitting device 234.

FIG. 27 shows the case where the light-emitting element has a structure of a top emission type, and light is radiated in a direction of an arrow shown in the drawing in the structure. Each pixel can carry out multicolor display by differentiating a light-emitting color by using a pixel 102*a* for red, a pixel 102*b* for green, and a pixel 102*c* for blue. At this time, color purity of the luminescence emitted outside can be improved by forming a colored layer 709*a*, a colored layer 709*b*, and a colored layer 709*c* corresponding to each color on the side of the sealing substrate 236. In addition, as the white light-emitting element, the pixels 102*a*, 102*b*, and 102*c* may be combined with the colored layers 709*a*, 709*b*, and 709*c*.

An external circuit 705 is connected to a scanning line or signal line connection terminal provided on one end of the TFT substrate 200 with a wiring board 704. In addition, a heat pipe 706 and a heat sink 707 may be provided to be in contact with the TFT substrate 200 or in vicinity thereof to have a structure in which a heat dissipation effect is improved.

FIG. 27 shows a top emission type EL module; however, a bottom emission structure may be acceptable by changing a disposition of a structure of the light-emitting element or the external circuit substrate.

FIG. 28 shows an example in which a resin film 709 is attached by using a sealant 235 and an adherent resin 702 on the side where a pixel portion is formed over a TFT substrate 200 to form a sealing structure. A gas barrier film preventing permeation of water vapor may be provided on the surface of the resin film 709. FIG. 28 shows a structure of bottom emission in which light of a light-emitting element is radiated through a substrate; however, a top emission structure is also acceptable by giving light-transmitting properties to the resin film 708 or the adherent resin 702. In either case, much more thin and lighter display device can be obtained by applying a film sealing structure.

Embodiment Mode 10

Figure 29:
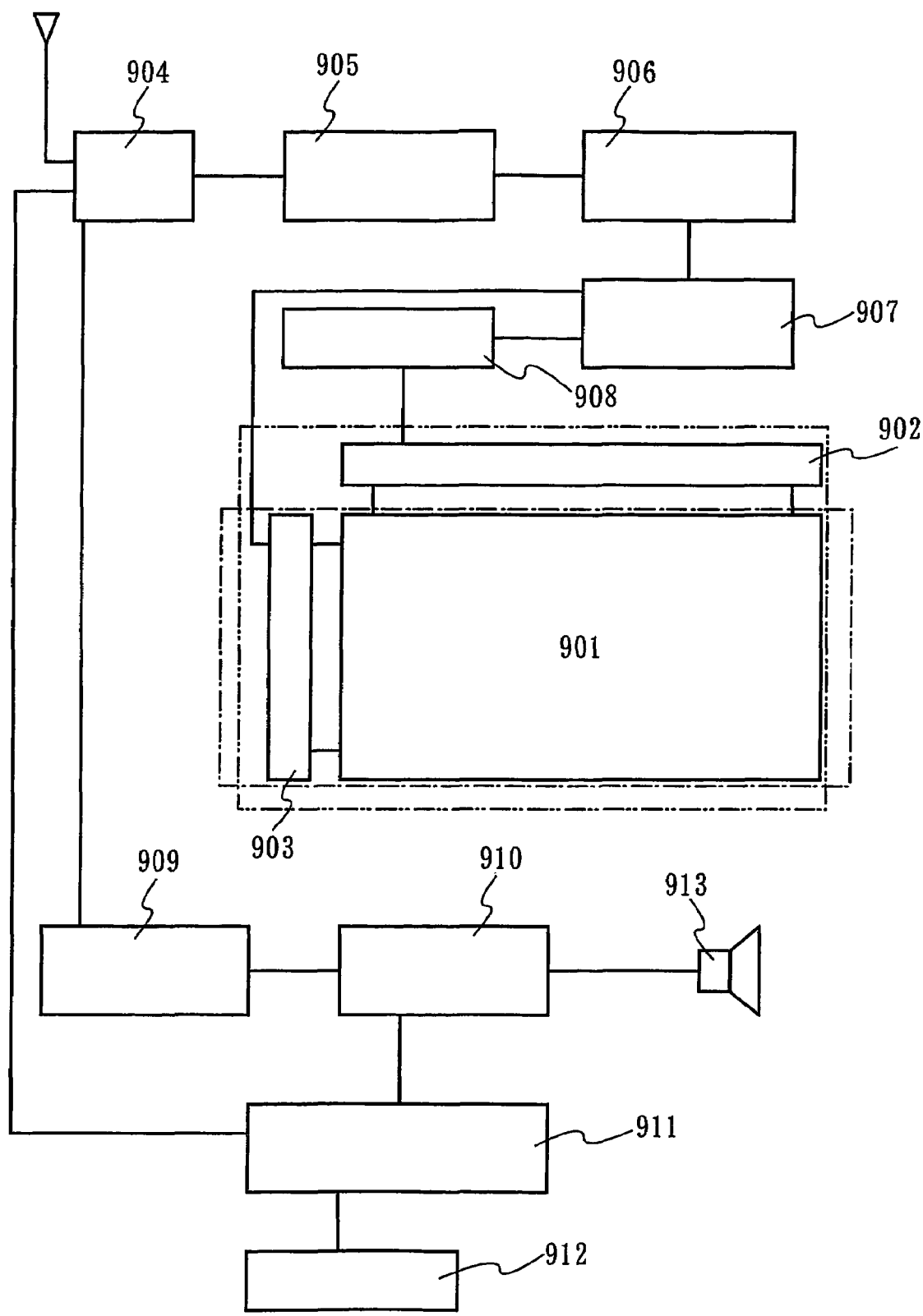
FIG. 29 shows a block diagram of a main structure of an EL television receiver according to a certain aspect of the invention.

An EL television receiver can be completed by an EL display module manufactured by Embodiment Mode 9. FIG. 29 shows a block diagram of a main structure of the EL television receiver. As a structure shown in FIG. 1, there is the case where a scanning line driver circuit 903 and a signal line driver circuit 902 are mounted by a TAB method by forming a pixel portion 901. As a structure shown in FIG. 2, the scanning line driver circuit 903 and the signal line driver circuit 902 are mounted on the pixel portion 901 and a periphery thereof by a COG method. As shown in FIG. 3, there is the case where a TFT is formed from an SAS, and the signal line driver circuit 902 is separately mounted as a driver IC by integrally forming the pixel portion 901 and the scanning line driver circuit 903 over a substrate. However, any one of modes may be applied.

As another structure of an external circuit, in an input side of a video signal, a signal received from a tuner 904 includes a video signal amplifier circuit 905 that amplifies a video signal; a video signal processing circuit 906 that converts signal outputted therefrom into a color signal corresponding to each color of red, green, and blue; a control circuit 907 for converting the video signal into an input specification of a driver IC; or the like. The control circuit 907 outputs a signal into the scanning line side and the signal line side, respectively. In the case of digital driving, a signal division circuit 908 is provided on the signal line side and may have a structure in which an input digital signal is provided by dividing into m-pieces.

In a signal received from the tuner 904, an audio signal is transmitted to an audio signal amplifier circuit 909, and the output thereof is provided for a speaker 913 through an audio signal processing circuit 910. A control circuit 911 receives control information of a receiving station (a receiving frequency) or sound volume from an input portion 912 and transmits a signal to the tuner 904 or the audio signal processing circuit 910.

Figure 30:
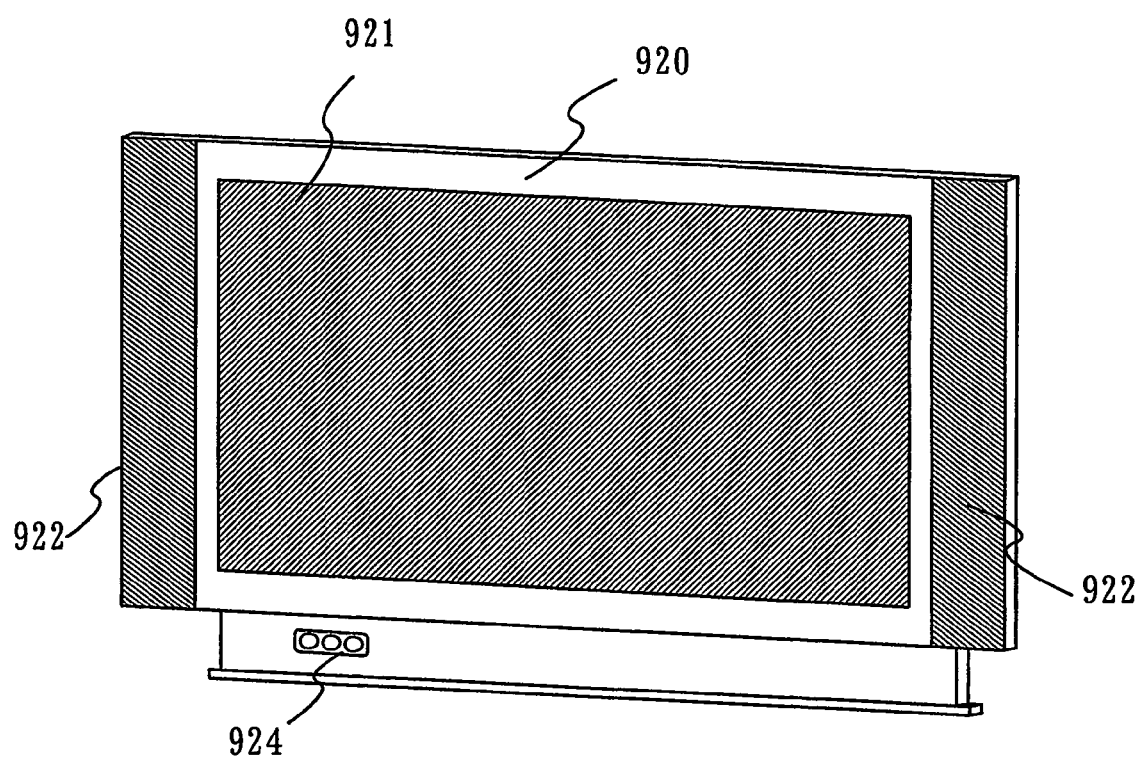
FIG. 30 shows a view illustrating a structure of an EL television receiver to be completed according to a certain aspect of the invention.

As shown in FIG. 30, the television receiver can be completed by incorporating the EL module illustrated in FIGS. 27 and 28 into a casing 920 by incorporating such an external circuit. A display screen 921 is formed by the EL display module, and a speaker 922, operation switches 924, and the like are provided as other attached equipment. Accordingly, the television receiver can be completed according to the present invention.

Of course, the invention is not limited to the television receiver and is applicable to a display medium with a large-sized area such as an information display board at a station, an airport, or the like, or an advertisement display board on the street as well as a monitor of a personal computer.

The invention claimed is:

1. A light-emitting device comprising:
a light-emitting element in which a light-emitting material is sandwiched between a pair of electrodes in a pixel; and
a thin film transistor including, from a substrate side, a lamination of:
a base layer;
a gate electrode formed by fusing conductive nanoparticles over the base layer;
a gate insulating layer formed in contact with the gate electrode, the gate insulating layer including at least a layer comprising a silicon nitride or a silicon nitride oxide, and a layer comprising a silicon oxide; and
a semiconductor layer,
wherein the base layer is formed from a metal material and the base layer not overlapping with the gate electrode is oxidized, and
wherein the light-emitting element and the thin film transistor are connected in the pixel.

2. A light-emitting device comprising:
a light-emitting element in which a light-emitting material is sandwiched between a pair of electrodes in a pixel; and
a thin film transistor including, from a substrate side, a lamination of:
a base layer;
a gate electrode formed by fusing conductive nanoparticles over the base layer;
a gate insulating layer formed in contact with the gate electrode, the gate insulating layer including at least a layer comprising a silicon nitride or a silicon nitride oxide, and a layer comprising a silicon oxide;
a semiconductor layer;
wirings connected to a source and a drain and formed by fusing conductive nanoparticles; and
a silicon nitride layer or silicon nitride oxide layer formed by being in contact with the wirings,
wherein the base layer is formed from a metal material and the base layer not overlapping with the gate electrode is oxidized, and
wherein the light-emitting element and the thin film transistor are connected in the pixel.

3. A light-emitting device comprising:
a light-emitting element in which a light-emitting material is sandwiched between a pair of electrodes in a pixel;
a first thin film transistor including, from a substrate side, a lamination of:
a base layer;
a gate electrode formed by fusing conductive nanoparticles over the base layer;
a gate insulating layer formed in contact with the gate electrode, the gate insulating layer including at least a layer comprising a silicon nitride or a silicon nitride oxide, and a layer comprising a silicon oxide; and
a semiconductor layer;
a driver circuit including a second thin film transistor formed by having the same layer structure as that of the first thin film transistor; and
a wiring extended from the driver circuit and connecting to the gate electrode of the first thin film transistor,
wherein the base layer is formed from a metal material and the base layer not overlapping with the date electrode is oxidized, and
wherein the light-emitting element and the thin film transistor are connected in the pixel.

4. A light-emitting device comprising:
a light-emitting element in which a light-emitting material is sandwiched between a pair of electrodes in a pixel;
a first thin film transistor including, from a substrate side, a lamination of:
a base layer;
a gate electrode formed by fusing conductive nanoparticles over the base layer;
a gate insulating layer formed in contact with the gate electrode, the gate insulating layer including at least a layer comprising a silicon nitride or a silicon nitride oxide, and a layer comprising a silicon oxide;
a semiconductor layer;
wirings connected to a source and a drain and formed by fusing conductive nanoparticles; and
a silicon nitride layer or silicon nitride oxide layer formed to be in contact with the wirings;
a driver circuit including a second thin film transistor formed by having the same layer structure as that of the first thin film transistor; and
a wiring extended from the driver circuit and connecting to the gate electrode of the first thin film transistor,
wherein the base layer is formed from a metal material and the base layer not overlapping with the gate electrode is oxidized, and
wherein the light-emitting element and the thin film transistor are connected in the pixel.

5. The light-emitting device according to any one of claims 1 to 4, wherein the conductive nanoparticles comprise silver.

6. The light-emitting device according to claim 2 or 4, wherein the semiconductor layer contains hydrogen and halogen and is a semi-amorphous semiconductor having a crystal structure.

7. The light-emitting device according to claim 2 or 4, wherein the driver circuit is composed only of an n-channel type thin film transistor.

8. The light-emitting device according to any one of claims 1 to 4, wherein the thin film transistor includes the semiconductor layer containing hydrogen and halogen and which is a semiconductor having a crystal structure, wherein the thin film transistor is capable of being operated in electric field effect mobility of from 1 $cm^2$/V·sec to 15 $cm^2$/V·sec $cm^2$.

9. The light-emitting device according to any one of claims 1 to 4, wherein the light-emitting device is a display screen.

* * * * *

UNITED STATES PATENT AND TRADEMARK OFFICE
CERTIFICATE OF CORRECTION

PATENT NO. : 7,709,843 B2  Page 1 of 1
APPLICATION NO. : 10/574880
DATED : May 4, 2010
INVENTOR(S) : Shunpei Yamazaki et al.

It is certified that error appears in the above-identified patent and that said Letters Patent is hereby corrected as shown below:

Col. 2, line 37, "and," should read "and".

Col. 4, line 36, "1 cm$^2$/V·sec to 15 cm$^2$/V·sec cm$^2$" should read "1 cm$^2$/V·sec to 15 cm$^2$/V·sec".

Col. 5, line 2, "ad EL" should read "an EL".

Col. 7, line 5, "Si$_2$H" should read "Si$_2$H$_6$".

Col. 9, line 19, "baling" should be "baking".

Col. 13, line 14, "228;" should be "228.".

Col. 16, line 49, "method in" should read "method. In".

In the claims, claim 3, col. 26, line 17, "date" should read "gate".

Signed and Sealed this

Tenth Day of August, 2010

David J. Kappos
*Director of the United States Patent and Trademark Office*